(12) United States Patent  
Sugiyama

(10) Patent No.: US 12,433,169 B2  
(45) Date of Patent: Sep. 30, 2025

(54) MAGNETIC STORAGE DEVICE

(71) Applicant: KIOXIA CORPORATION, Tokyo (JP)

(72) Inventor: Hideyuki Sugiyama, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 590 days.

(21) Appl. No.: 17/411,775

(22) Filed: Aug. 25, 2021

(65) Prior Publication Data

US 2022/0093850 A1 Mar. 24, 2022

(30) Foreign Application Priority Data

Sep. 18, 2020 (JP) .................................. 2020-157901

(51) Int. Cl.

| | |
|---|---|
| *H01L 43/08* | (2006.01) |
| *H10B 61/00* | (2023.01) |
| *H10N 50/01* | (2023.01) |
| *H10N 50/10* | (2023.01) |
| *H10N 50/80* | (2023.01) |

(52) U.S. Cl.  
CPC ............. *H10N 50/10* (2023.02); *H10B 61/10* (2023.02); *H10N 50/01* (2023.02); *H10N 50/80* (2023.02)

(58) Field of Classification Search  
CPC ......... H10N 50/10; H10N 50/80; H10N 50/01  
USPC ....................................................... 257/421  
See application file for complete search history.

(56) References Cited

U.S. PATENT DOCUMENTS

| | | | |
|---|---|---|---|
| 7,420,786 B2 | 9/2008 | Sugiyama et al. | |
| 9,443,905 B1 | 9/2016 | Bandic et al. | |
| 10,546,996 B2 | 1/2020 | Mo et al. | |
| 2008/0151614 A1* | 6/2008 | Guo ................... | G11C 11/1675 365/171 |

(Continued)

FOREIGN PATENT DOCUMENTS

JP 2006-148039 A 6/2006

OTHER PUBLICATIONS

Tanaka et al. "Bit Cost Scalable Technology with Punch and Plug Process for Ultra High Density Flash Memory", 2007 Symposium on VLSI Technology Digest of Technical Papers, pp. 14-15.

(Continued)

*Primary Examiner* — Dzung Tran  
(74) *Attorney, Agent, or Firm* — Kim & Stewart LLP

(57) ABSTRACT

A magnetic storage device includes a first stacked structure in which first electrode layers and first insulating layers are alternately stacked in a first direction, a first common electrode, and a first intermediate structure between the first stacked structure and the first common electrode and includes first element portions and first non-element portions that are alternately stacked in the first direction. Each of the first element portions includes a first magnetoresistance effect element that includes a first variable magnetization portion having a variable magnetization direction, a first fixed magnetization portion having a fixed magnetization direction, and a first tunnel barrier layer between the first variable magnetization portion and the first fixed magnetization portion. Each of the first non-element portions includes a first demagnetized portion adjacent to the first variable magnetization portion of one of the first element portions that is adjacent in the first direction.

20 Claims, 31 Drawing Sheets

(56) References Cited

U.S. PATENT DOCUMENTS

| | | | | |
|---|---|---|---|---|
| 2009/0174015 A1* | 7/2009 | Gu | ......................... | H10N 50/10 |
| | | | | 257/E29.323 |
| 2013/0244344 A1* | 9/2013 | Malmhall | .............. | B82Y 10/00 |
| | | | | 438/3 |
| 2018/0097006 A1* | 4/2018 | Kim | ....................... | H10B 41/27 |
| 2019/0280195 A1* | 9/2019 | Sonoda | .................. | H10B 61/00 |
| 2019/0296230 A1 | 9/2019 | Araki | | |

OTHER PUBLICATIONS

Sugiyama et al. "A novel magnetic tunnel junction structure using the edge of a magnetic film" Available online Nov. 20, 2006, Journal of Magnetism and Magnetic Materials 310 (2007), pp. 2003-2005.
S.-W. Chung et al., "4Gbit density STT-MRAM using perpendicular MTJ realized with compact cell structure" 2016 IEEE International Electron Devices Meeting (IEDM), 2016, pp. 27.1.1-27.1.4.

\* cited by examiner

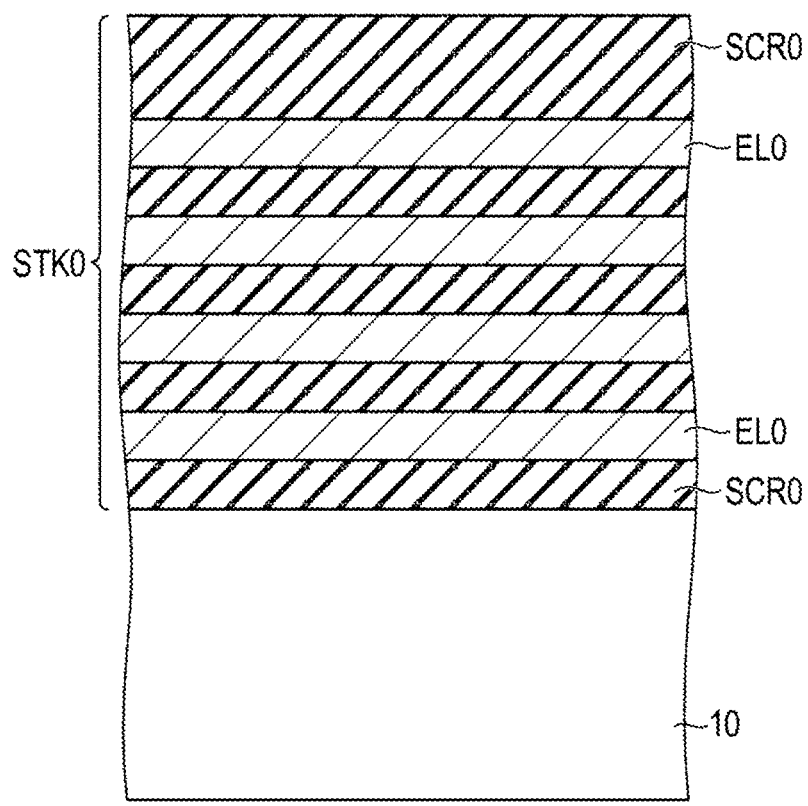

MAGNETIC STORAGE DEVICE

CROSS-REFERENCE TO RELATED APPLICATION

This application is based upon and claims the benefit of priority from Japanese Patent Application No. 2020-157901, filed Sep. 18, 2020, the entire contents of which are incorporated herein by reference.

FIELD

An embodiment described herein relates generally to a magnetic storage device.

BACKGROUND

A magnetic storage device in which magnetoresistance effect elements are integrated on a semiconductor substrate has been proposed.

BRIEF DESCRIPTION OF THE DRAWINGS

FIG. 7A through FIG. 7M are schematic cross-sectional view illustrating aspects of a method of manufacturing a magnetic storage device having a first memory array configuration.

DETAILED DESCRIPTION

One or more embodiments provide a magnetic storage device that can increase the degree of integration of magnetoresistance effect elements.

In general, according to one embodiment, a magnetic storage device includes a first memory structure that includes a first stacked structure in which a plurality of first electrode layers and a plurality of first insulating layers are alternately stacked in a first direction, a first common electrode, and a first intermediate structure that is between the first stacked structure and the first common electrode and includes a plurality of first element portions and a plurality of first non-element portions that are alternately stacked in the first direction. Each of the first element portions includes a first magnetoresistance effect element that includes a first variable magnetization portion having a variable magnetization direction, a first fixed magnetization portion having a fixed magnetization direction, and a first tunnel barrier layer between the first variable magnetization portion and the first fixed magnetization portion. Each of the first non-element portions includes a first demagnetized portion adjacent to the first variable magnetization portion of one of the first element portions that is adjacent in the first direction.

Hereinafter, certain example embodiments will be described with reference to the drawings. In the embodiments below, a magnetic tunnel junction (MTJ) element will be described as one example of a magnetoresistance effect element.

Basic Configuration

Figure 1:
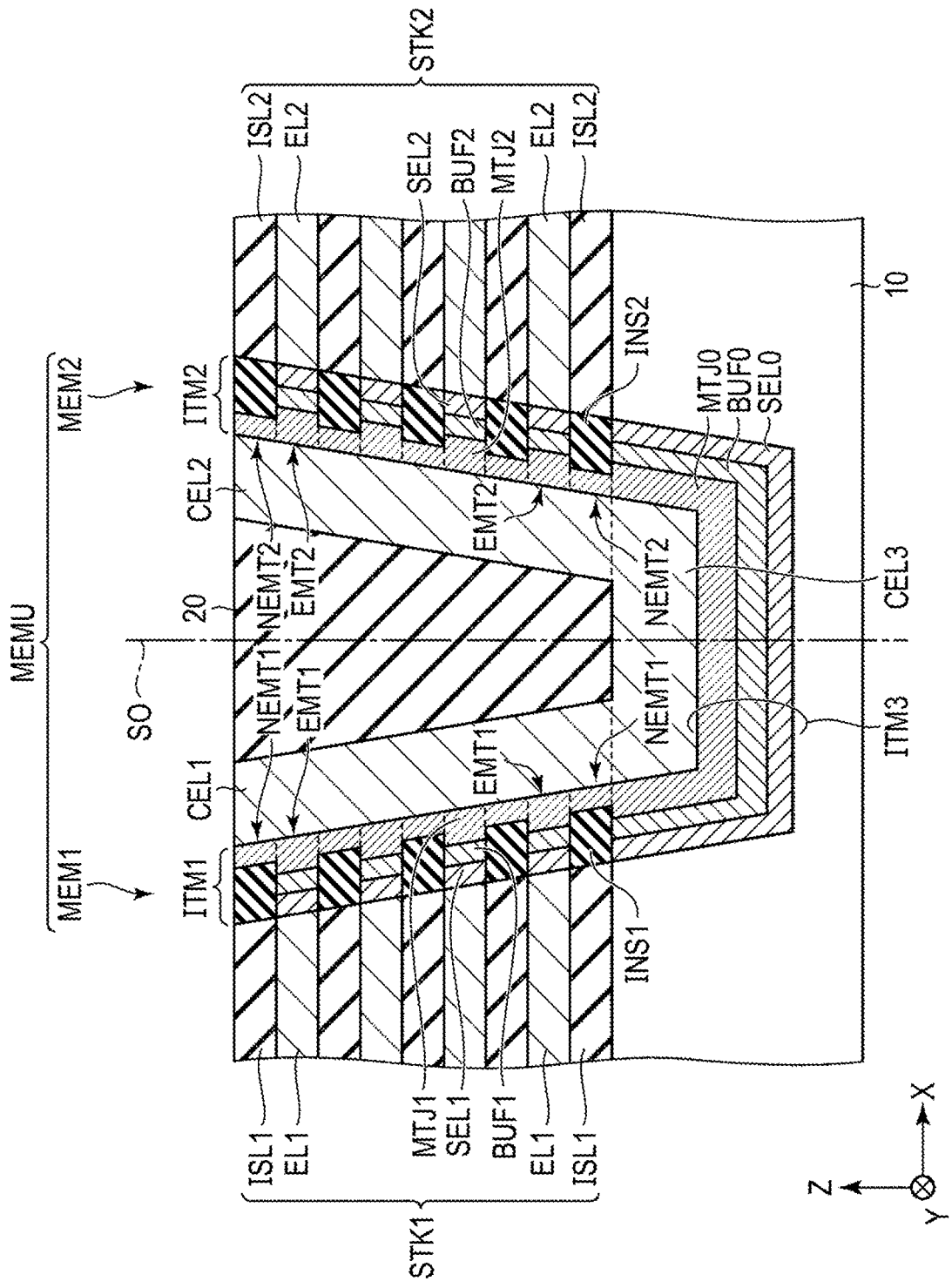
FIG. 1 is a schematic cross-sectional view of a magnetic storage device according to an embodiment.

FIG. 1 is a schematic cross-sectional view of a nonvolatile magnetic storage device according to an embodiment.

As shown in FIG. 1, a memory structure unit MEMU is provided on a lower structure 10. The lower structure 10 comprises a semiconductor substrate or the like. The memory structure unit MEMU includes a first memory structure portion MEM1 and a second memory structure portion MEM2.

The first memory structure portion MEM1 includes a first stacked structure portion STK1, a first common electrode portion CEL1, and a first intermediate structure portion ITM1 that is provided between a side surface of the first stacked structure portion STK1 and the first common electrode portion CEL1.

The first stacked structure portion STK1 has a structure in which a plurality of first electrode layers EL1 and a plurality of first insulating layer ISL1 are alternately stacked in the Z direction. Both the first common electrode portion CEL1 and the first intermediate structure portion ITM1 are formed along a side surface of the first stacked structure portion STK1.

The first intermediate structure portion ITM1 includes a plurality of first element configuration portions EMT1 and a plurality of first non-element configuration portions NEMT1.

The first element configuration portion EMT1 is positioned between the first common electrode portion CEL1 and the corresponding first electrode layer EL1. The first element configuration portion EMT1 includes a first magnetoresistance effect element portion MTJ1, a first selector portion SEL1, which may also be referred to as a first switching element portion, and a conductive first buffer portion BUF1 position between the first magnetoresistance effect element portion MTJ1 and the first selector portion SEL1. That is, the first magnetoresistance effect element portion MTJ1 and the first selector portion SEL1 are connected in series via the first buffer portion BUF1.

The first non-element configuration portion NEMT1 is positioned between the first common electrode portion CEL1 and the corresponding first insulating layer ISL1, and includes a first insulating portion INS1.

The second memory structure portion MEM2 includes a second stacked structure portion STK2, a second common electrode portion CEL2, and a second intermediate structure portion ITM2 that is provided between a side surface of the second stacked structure portion STK2 and the second common electrode portion CEL2.

The second stacked structure portion STK2 has a structure in which a plurality of second electrode layers EL2 and a plurality of second insulating layers ISL2 are alternately stacked in the Z direction. Both the second common electrode portion CEL2 and the second intermediate structure portion ITM2 are formed along the side surface of the second stacked structure portion STK2.

The second intermediate structure portion ITM2 includes a plurality of second element configuration portions EMT2 and a plurality of second non-element configuration portions NEMT2.

The second element configuration portion EMT2 is positioned between the second common electrode portion CEL2 and the corresponding second electrode layer EL2. The second element configuration portion EMT2 includes a second magnetoresistance effect element portion MTJ2, a second selector portion SEL2, which may also be referred to as a second switching element portion, and a conductive second buffer portion BUF2 positioned between the second magnetoresistance effect element portion MTJ2 and the second selector portion SEL2. That is, the second magnetoresistance effect element portion MTJ2 and the second selector portion SEL2 are connected in series via the second buffer portion BUF2.

The second non-element configuration portion NEMT2 is positioned between the second common electrode portion CEL2 and the corresponding second insulating layer ISL2, and includes a second insulating portion INS2.

The first stacked structure portion STK1 and the second stacked structure portion STK2 face each other in the X direction via the first intermediate structure portion ITM1, the first common electrode portion CEL1, the second common electrode portion CEL2, and the second intermediate structure portion ITM2. A recess portion between the first memory structure portion MEM1 and the second memory structure portion MEM2 is filled with an insulating layer 20.

The first common electrode portion CEL1 and the second common electrode portion CEL2 are connected via a third common electrode portion CEL3. That is, the first, second and third common electrode portions CEL1, CEL2 and CEL3 form a continuous common electrode layer.

The first intermediate structure portion ITM1 and the second intermediate structure portion ITM2 are connected via a third intermediate structure portion ITM3. That is, the first, second and third intermediate structure portions ITM1, ITM2 and ITM3 form a continuous intermediate structural layer. Specifically, the third intermediate structure portion ITM3 includes a layer MTJ0, a layer SEL0, and a layer BUF0.

As can be seen from the above, the memory structure unit MEMU has a structure mutually symmetrical with respect to a target plane S0 that is parallel to the Y direction and the Z direction, and the first memory structure portion MEM1 and the second memory structure portion MEM2 have structures equivalent to each other. Therefore, in the following description, for the sake of simplicity, only the first memory structure portion MEM1 will be described and the second memory structure portion MEM2 may not be described. It is noted that the description of the second memory structure portion MEM2 may be basically similar to that of the first memory structure portion MEM1.

First Example

Next, a first example of the magnetic storage device will be described with reference to the cross-sectional view shown in FIG. 2.

First, the first element configuration portion EMT1 will be described.

Figure 2:
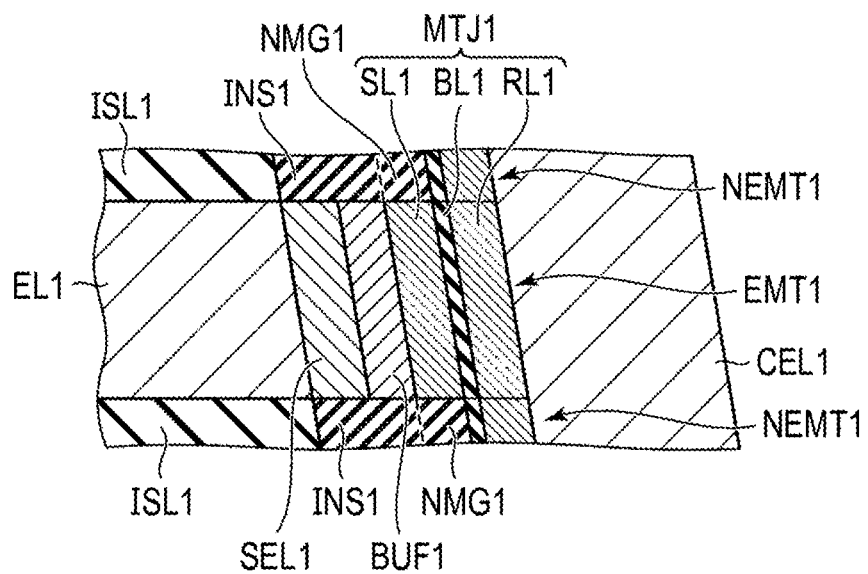
FIG. 2 through FIG. 5 are schematic cross-sectional views of configuration examples of a magnetic storage device.

As shown in FIG. 2, the first selector portion SEL1 is positioned between the first magnetoresistance effect element portion MTJ1 and the first electrode layer EL1. That is, the first selector portion SEL1 is positioned adjacent to the first electrode layer EL1, and the first magnetoresistance effect element portion MTJ1 is positioned adjacent to the first common electrode portion CEL1.

The first magnetoresistance effect element portion MTJ1 includes a first storage layer portion SL1 (also referred to as a first variable magnetization portion SL1), a first reference layer portion RL1 (also referred to as a first variable magnetization portion RL1), and a first tunnel barrier layer portion BL1. As shown in FIG. 2, the first storage layer portion SL1 is positioned on the first selector portion SEL1 side (which is also the first electrode layer EL1 side), and the first reference layer portion RL1 is positioned on the first common electrode portion CEL1 side.

The first storage layer portion SL1 is a ferromagnetic layer having a variable magnetization direction, and is formed of, for example, a CoFeB layer containing cobalt (Co), iron (Fe), and boron (B). The variable magnetization direction means that the magnetization direction changes in response to a predetermined write current.

The first reference layer portion RL1 is a ferromagnetic layer having a fixed magnetization direction, and is formed of, for example, a CoFeB layer containing cobalt (Co), iron (Fe), and boron (B) and a Co/Pt superlattice layer and the like. The fixed magnetization direction means that the magnetization direction does not change in response to a predetermined write current.

The first tunnel barrier layer portion BL1 is an insulating layer provided between the first storage layer portion SL1 and the first reference layer portion RL1. The first tunnel barrier layer portion BL1 is formed of, for example, an MgO layer containing magnesium (Mg) and oxygen (O).

When the magnetization direction of the first storage layer portion SL1 is parallel to the magnetization direction of the first reference layer portion RL1, the first magnetoresistance effect element portion MTJ1 is in a low resistance state, and when the magnetization direction of the first storage layer portion SL1 is antiparallel to the magnetization direction of the first reference layer portion RL1, the first magnetoresistance effect element portion MTJ1 is in a high resistance state. Therefore, binary data (0 or 1) can be stored in the first magnetoresistance effect element portion MTJ1 according to the resistance state of the first magnetoresistance effect element portion MTJ1. In addition, the low resistance state or the high resistance state can be changed or set in the first magnetoresistance effect element portion MTJ1 according to the direction of current flowing through the first magnetoresistance effect element portion MTJ1.

The first selector portion SEL1 is a two-terminal type switching element connected in series with the first magnetoresistance effect element portion MTJ1. When a voltage applied between the two terminals is lower than a threshold value, the two-terminal type switching element is in a high resistance state, for example, an electrically non-conductive state. In addition, when the voltage applied between the two terminals is equal to or higher than the threshold value, the two-terminal type switching element is in a low resistance state, for example, an electrically conductive state.

By applying a voltage equal to or higher than the predetermined voltage between the first electrode layer EL1 and the first common electrode portion CEL1, the first selector portion SEL1 becomes an ON state (a conductive state), and it is possible to write to or read from the first magnetoresistance effect element portion MTJ1.

Next, the first non-element configuration portion NEMT1 will be described.

A portion of the first non-element configuration portion NEMT1 adjacent to the first storage layer portion SL1 (more particularly a portion adjacent to a film surface of the first storage layer portion SL1) is a demagnetized portion NMG1. Therefore, the two first storage layer portions SL1 adjacent to each other are magnetically separated by the demagnetized portion NMG1 that is interposed therebetween.

In addition, at least a part of the first non-element configuration portion NEMT1 is formed by insulating the layer MTJ0 for the magnetoresistance effect element or the like by oxidation from the side where the first insulating layer ISL1 is formed. Therefore, the portion of the first non-element configuration portion NEMT1 which is in contact with at least the first insulating layer ISL1 is the insulating portion INS1.

The demagnetized portion NMG1 is formed by insulating the layer for forming the first storage layer portion SL1 by oxidation. Therefore, the demagnetized portion NMG1 is insulated. In addition, a portion of the first non-element configuration portion NEMT1 adjacent to the first selector portion SEL1 and the first buffer portion BUF is also insulated.

As described above, since the demagnetized portion NMG1 is formed by insulating the layer for forming the first storage layer portion SL1 by oxidation, the demagnetized portion NMG1 contains a magnetic element, oxygen and the like contained in the first storage layer portion SL1. Specifically, the demagnetized portion NMG1 in this example contains cobalt (Co) and iron (Fe) as the magnetic elements, and further contains boron (B) and oxygen (O).

The demagnetized portion NMG1 may not be insulated in some examples. However, by insulating the demagnetized portion NMG1, it is possible to prevent an MR ratio of the first magnetoresistance effect element portion MTJ1 from decreasing. Similarly, the portion of the first non-element configuration portion NEMT1 adjacent to the first buffer portion BUF may not be insulated. However, by insulating, it is possible to prevent the MR ratio of the first magnetoresistance effect element portion MTJ1 from decreasing.

A portion of the first non-element configuration portion NEMT1 adjacent to the first reference layer portion RL1 may or may not be demagnetized. In addition, a portion of the first non-element configuration portion NEMT1 adjacent to the first reference layer portion RL1 may or may not be insulated.

Second Example

Figure 3:
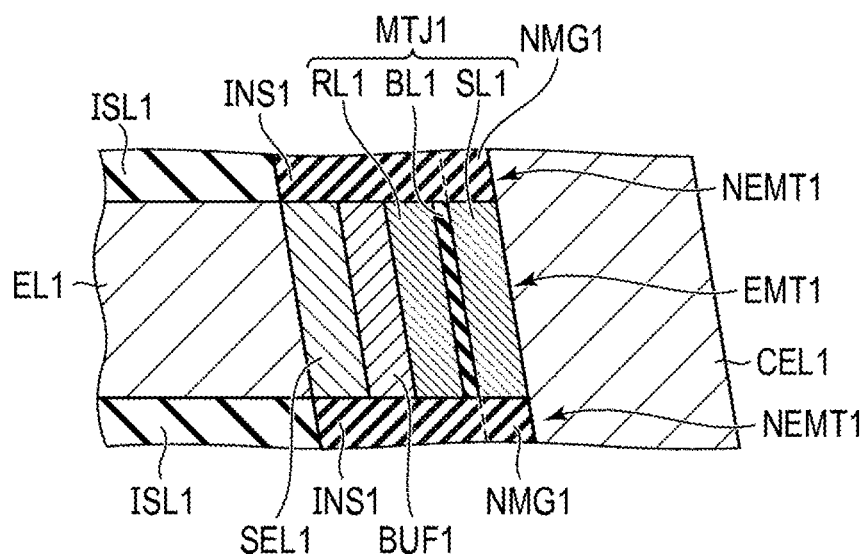

Next, a second example of the magnetic storage device will be described with reference to the cross-sectional view shown in FIG. 3. The basic structure is the same as the first example described above. Therefore, the descriptions of the elements in the first example may be omitted.

First, the first element configuration portion EMT1 will be described.

Similarly to the first example, the first selector portion SEL1 is positioned between the first magnetoresistance effect element portion MTJ1 and the first electrode layer EL1. However, the first reference layer portion RL1 in FIG. 3 is positioned on the first selector portion SEL1 side (which is also the first electrode layer EL1 side), and the first storage layer portion SL1 is positioned on the first common electrode portion CEL1 side. Other configurations of the first element configuration portion EMT1 are the same as those in the first example described above.

Next, the first non-element configuration portion NEMT1 will be described.

Similarly to the first example, a portion of the first non-element configuration portion NEMT1 adjacent to the first storage layer portion SL1 is the demagnetized portion NMG1. In addition, the portion of the first non-element configuration portion NEMT1 which is in contact with at least the first insulating layer ISL1 is the insulating portion INS1.

Furthermore, similarly to the first example, the demagnetized portion NMG1 is formed by insulating the layer for forming the first storage layer portion SL1. Therefore, the demagnetized portion NMG1 is insulated. In addition, the portion of the first non-element configuration portion NEMT1 adjacent to the first selector portion SEL1, the first buffer portion BUF, and the first reference layer portion RL1, is also insulated.

Similarly to the first example, the demagnetized portion NMG1 may not be insulated. Similarly, the portion of the first non-element configuration portion NEMT1 adjacent to the first reference layer portion RL1 may not be insulated. Furthermore, the portion of the first non-element configuration portion NEMT1 adjacent to the first buffer portion BUF may not be insulated either. It is noted that, by insulating these portions, it is possible to prevent the MR ratio of the first magnetoresistance effect element portion MTJ1 from decreasing.

A portion of the first non-element configuration portion NEMT1 adjacent to the first reference layer portion RL1 may or may not be demagnetized. In the case that the demagnetized portion NMG1 is formed, the portion of the first non-element configuration portion NEMT1 adjacent to the first reference layer portion RL1 is also demagnetized.

Third Example

Next, a third example of the magnetic storage device will be described with reference to the cross-sectional view shown in FIG. 4. The basic structure is the same as the first example described above. Therefore, the descriptions of the elements in the first example may be omitted.

First, the first element configuration portion EMT1 will be described.

Figure 4:
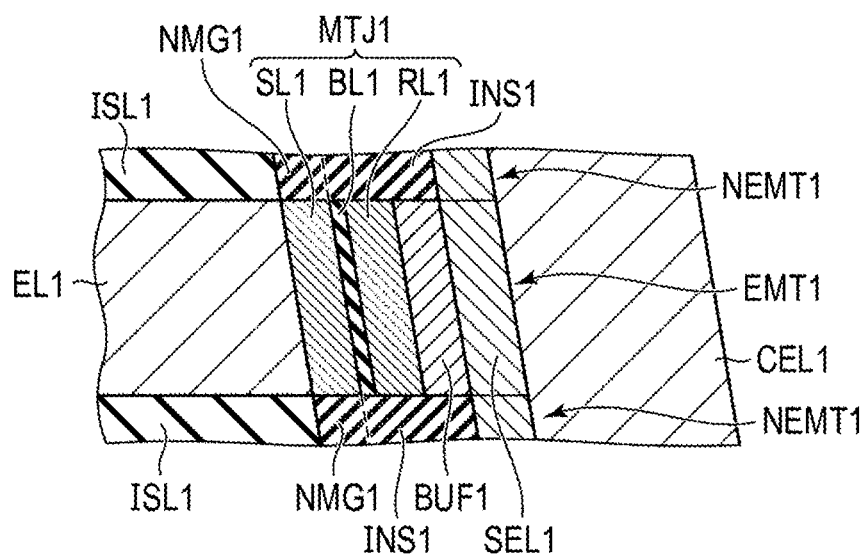

The first magnetoresistance effect element portion MTJ1 in FIG. 4 is positioned between the first selector portion SEL and the first electrode layer EL1. That is, the first magnetoresistance effect element portion MTJ1 is positioned adjacent to the first electrode layer EL1, and the first selector portion SEL1 is positioned adjacent to the first common electrode portion CEL1. In addition, the first storage layer portion SL1 is positioned on the first electrode layer EL1 side, and the first reference layer portion RL1 is positioned on the first selector portion SEL1 side (which is also first common electrode portion CEL1 side).

Next, the first non-element configuration portion NEMT1 will be described.

Similarly to the first example, a portion of the first non-element configuration portion NEMT1 adjacent to the first storage layer portion SL1 is the demagnetized portion NMG1.

The demagnetized portion NMG1 needs to be insulated. In addition, the portion of the first non-element configuration portion NEMT1 adjacent to the first reference layer portion RL1 and the first buffer portion BUF also needs to be insulated. This is because, if these portions are not insulated, two adjacent first magnetoresistance effect element portions MTJ1 become conductive and the proper operation is hindered.

A portion of the first non-element configuration portion NEMT1 adjacent to the first reference layer portion RL1 may or may not be demagnetized.

Fourth Example

Figure 5:
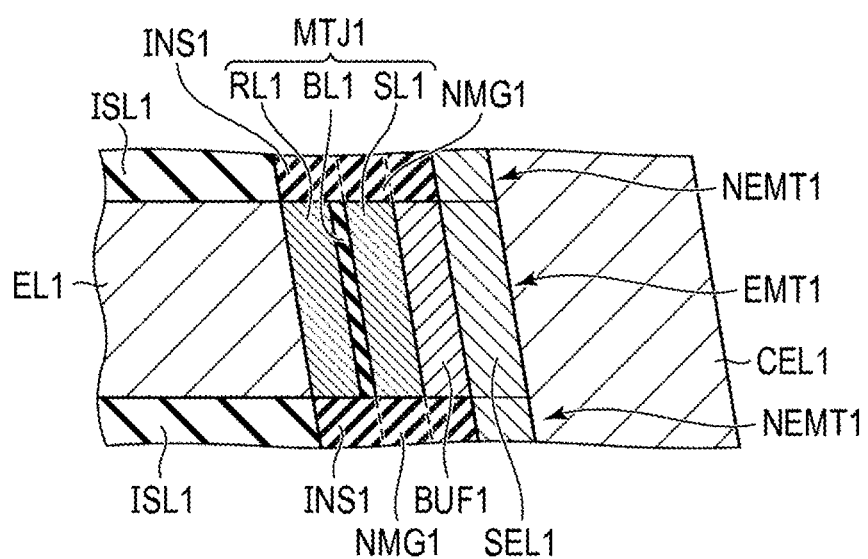

Next, a fourth example of the magnetic storage device will be described with reference to the cross-sectional view shown in FIG. 5. The basic structure is the same as the first and third examples described above. Therefore, the descriptions of the elements described in the first and third examples may be omitted.

First, the first element configuration portion EMT1 will be described.

Similarly to the third example described above, the first magnetoresistance effect element portion MTJ1 is positioned between the first selector portion SEL1 and the first electrode layer EL1. However, the first reference layer portion RL1 is positioned on the first electrode layer EL1 side, and the first storage layer portion SL1 is positioned on the first selector portion SEL1 side (which is also the first common electrode portion CEL1 side). Other configurations of the first element configuration portion EMT1 are the same as those in the third example described above.

Next, the first non-element configuration portion NEMT1 will be described.

Similarly to the first, second and third examples, a portion of the first non-element configuration portion NEMT1 adjacent to the first storage layer portion SL1 is the demagnetized portion NMG1.

In addition, similarly to the third example, the demagnetized portion NMG1 needs to be insulated. Furthermore, the portion of the first non-element configuration portion NEMT1 adjacent to the first reference layer portion RL1 and the first buffer portion BUF also needs to be insulated.

A portion of the first non-element configuration portion NEMT1 adjacent to the first reference layer portion RL1 may or may not be demagnetized. In the case that the demagnetized portion NMG1 is formed, the portion of the first non-element configuration portion NEMT1 adjacent to the first reference layer portion RL1 is also demagnetized.

As described above, the first memory structure portion MEM1 includes: a first stacked structure portion STK1 in which a plurality of first electrode layers EL1 and a plurality of first insulating layers ISL1 are alternately stacked, a first common electrode portion CEL1, and a first intermediate structure portion ITM1 provided between the side surface of the first stacked structure portion STK1 and the first common electrode portion CEL1. In the first intermediate structure portion ITM1, a plurality of first element configuration portions EMT1 and a plurality of first non-element configuration portions NEMT1 are alternately provided. The second memory structure portion MEM2 has the same configuration as that of the first memory structure portion MEM1.

With such a configuration, a plurality of memory cells including the magnetoresistance effect element can be three-dimensionally arranged, and thus, it is possible to obtain the magnetic storage device having a high degree of integration.

First Memory Array Configuration

Next, a first memory array configuration for the magnetic storage device will be described. That is, a plurality of memory structure units MEMU described above are arranged in an array according to the first memory array configuration will be described.

Figure 6:
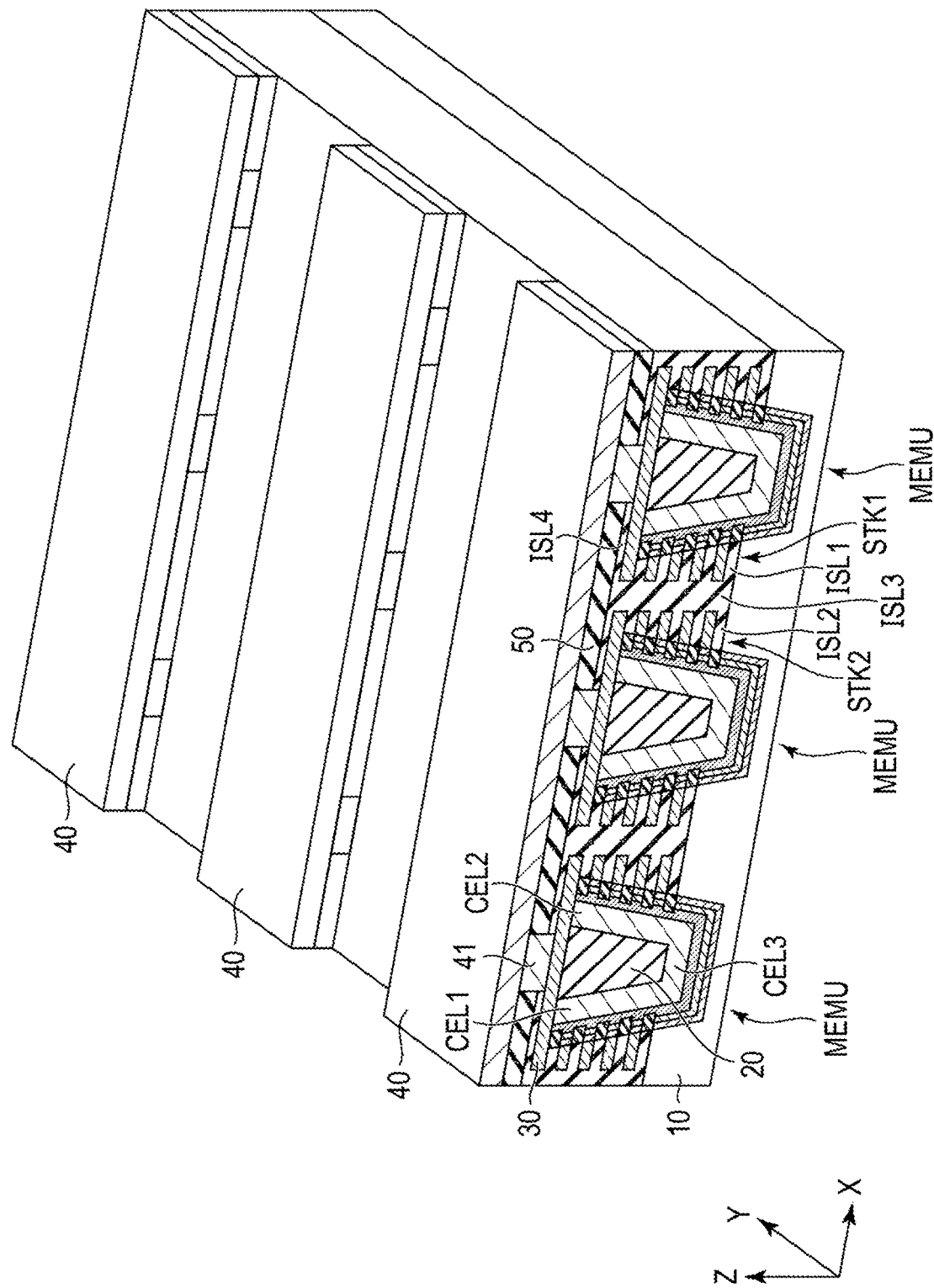
FIG. 6 is a schematic perspective view of a magnetic storage device having a first memory array configuration.

FIG. 6 is a schematic perspective view of the magnetic storage device having the first memory array configuration.

As shown in FIG. 6, a plurality of memory structure units MEMU are arranged in an array in the X direction and the Y direction.

For the convenience of description, the memory structure units MEMU adjacent to each other in the X direction are referred to as a first memory structure unit and a second memory structure unit, respectively. In such a case, an intermediate insulating portion ISL3 formed by the common process using the same insulating material as the insulating material of the first insulating layer ISL1 and the second insulating layer ISL2 is interposed between the first stacked structure portion STK1 in the first memory structure unit and the second stacked structure portion STK2 in the second memory structure unit. That is, the first insulating layer ISL1 and the second insulating layer ISL2 are connected via the intermediate insulating portion ISL3.

A protection layer 30 formed of a conductive material is provided on each memory structure unit MEMU. That is, the conductive protection layer 30 is connected to the first common electrode portion CEL1 and the second common electrode portion CEL2.

The first stacked structure portion STK1 includes a first extending portion extending in the Y direction, and two first stacked structure portions STK1 of the memory structure units MEMU adjacent to each other in the Y direction are connected via the first extending portion. Similarly, the second stacked structure portion STK2 includes a second extending portion extending in the Y direction, and two second stacked structure portions STK2 of the memory structure units MEMU adjacent to each other in the Y direction are connected via the second extending portion. In addition, the intermediate insulating portion ISL3 positioned between the first stacked structure portion STK1 and the second stacked structure portion STK2 also extends along the Y direction.

The first stacked structure portion STK1 and the first extending portion, the second stacked structure portion STK2 and the second extending portion, the intermediate insulating portion ISL3 extending along the Y direction, and the protection layer 30 are covered by an upper insulating portion ISL4. The upper insulating portion ISL4 is formed by a common process using the same insulating material as the insulating material of the first insulating layer ISL1, the second insulating layer ISL2 and the intermediate insulating portion ISL3. That is, the first insulating layer ISL1, the second insulating layer ISL2, the intermediate insulating portion ISL3, and the upper insulating portion ISL4 are connected to each other.

A wiring 40 extending in the X direction is provided above the memory structure unit MEMU arrayed in the X direction. In addition, an insulating layer 50 is provided between the wiring 40 and the upper insulating portion ISL4. The wiring 40 is connected to the conductive protection layer 30 via a contact 41 provided in the insulating layer 50 and the upper insulating portion ISL4. Therefore, first common electrode portion CEL1, second common electrode portion CEL2, and third common electrode portion CEL3 in the plurality of memory structure units MEMU arrayed in the X direction are electrically connected in common.

The wiring 40 functions as a word line. In addition, the first electrode layer EL1 and the second electrode layer EL2 function as bit lines. A desired memory cell is selected by applying a particular voltage to a desired word line and a desired bit line, and the selector portion in the desired memory cell becomes an ON state. As a result, it is possible to write or read to and from the magnetoresistance effect element portion in the desired memory cell.

Next, a method of manufacturing the magnetic storage device having the aforementioned memory array configuration will be described with reference to the cross-sectional views schematically shown in FIG. 7A to FIG. 7M and the perspective view schematically shown in FIG. 8.

First, as shown in FIG. 7A, a stack film STK0 in which a plurality of sacrificial insulating layers SCR0 and a plurality of electrode layers EL0 are alternately stacked is formed on the lower structure 10 which may comprise a semiconductor substrate. The sacrificial insulating layer SCR0 is made of silicon nitride, and the electrode layer EL0 is made of a metal material.

Figure 7B:
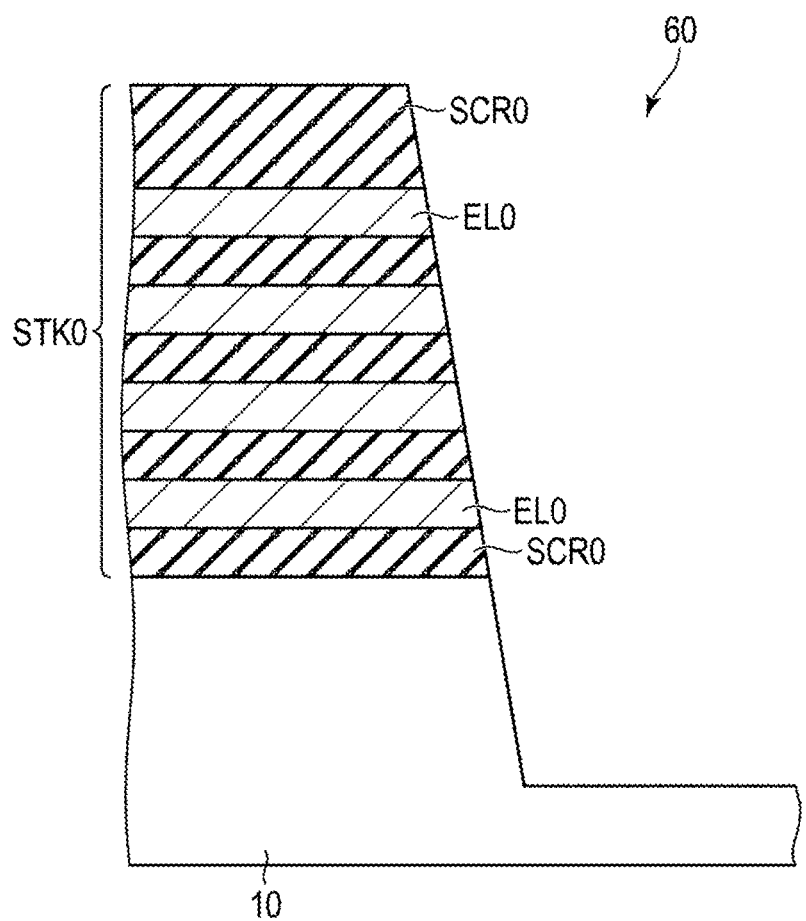
Figure 8:
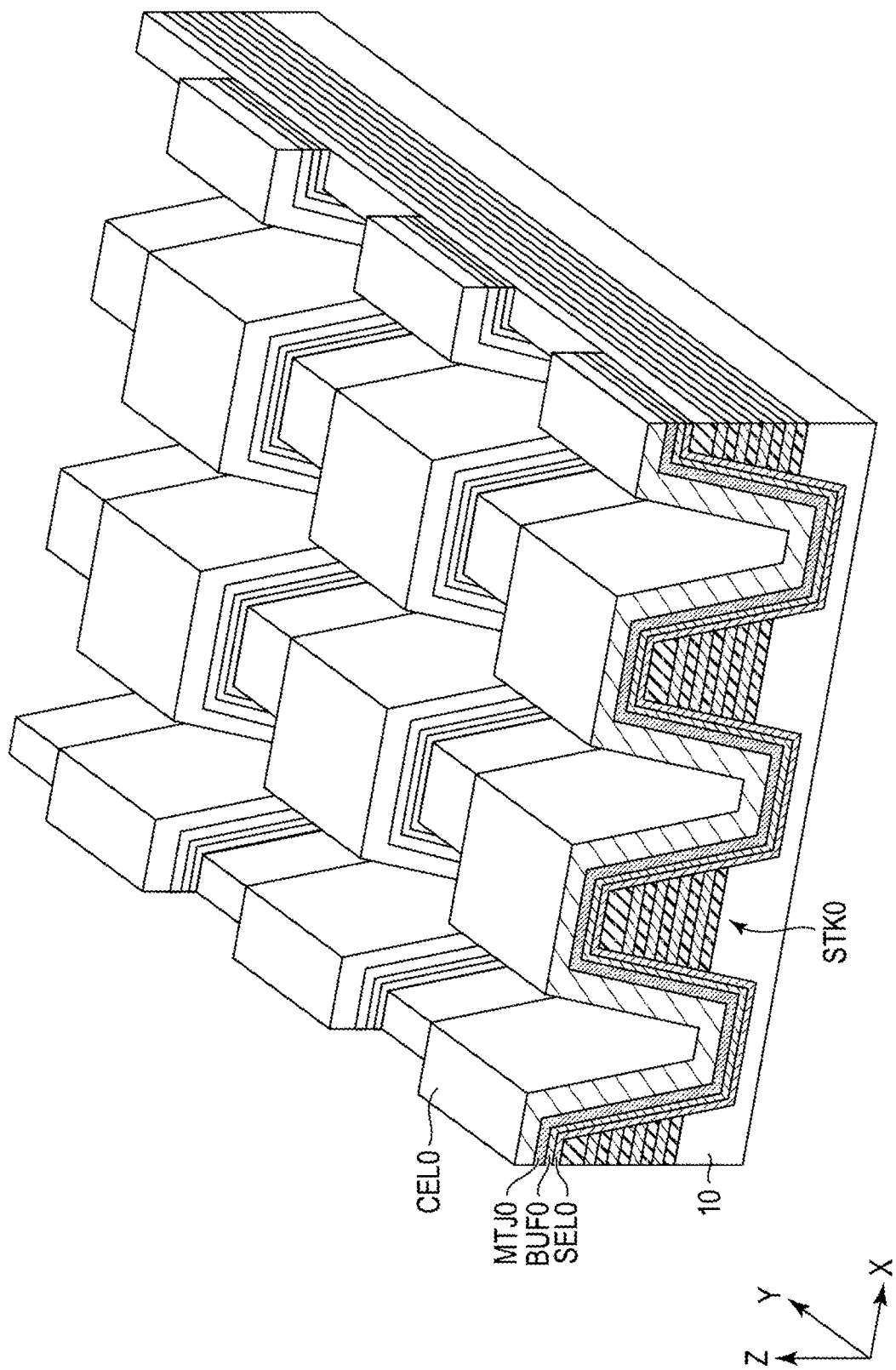
FIG. 8 is a schematic perspective view illustrating aspects of a method of manufacturing a magnetic storage device having a first memory array configuration.

Next, as shown in FIG. 7B, the stack film STK0 and the lower structure 10 are patterned to form a groove 60.

Figure 7C:
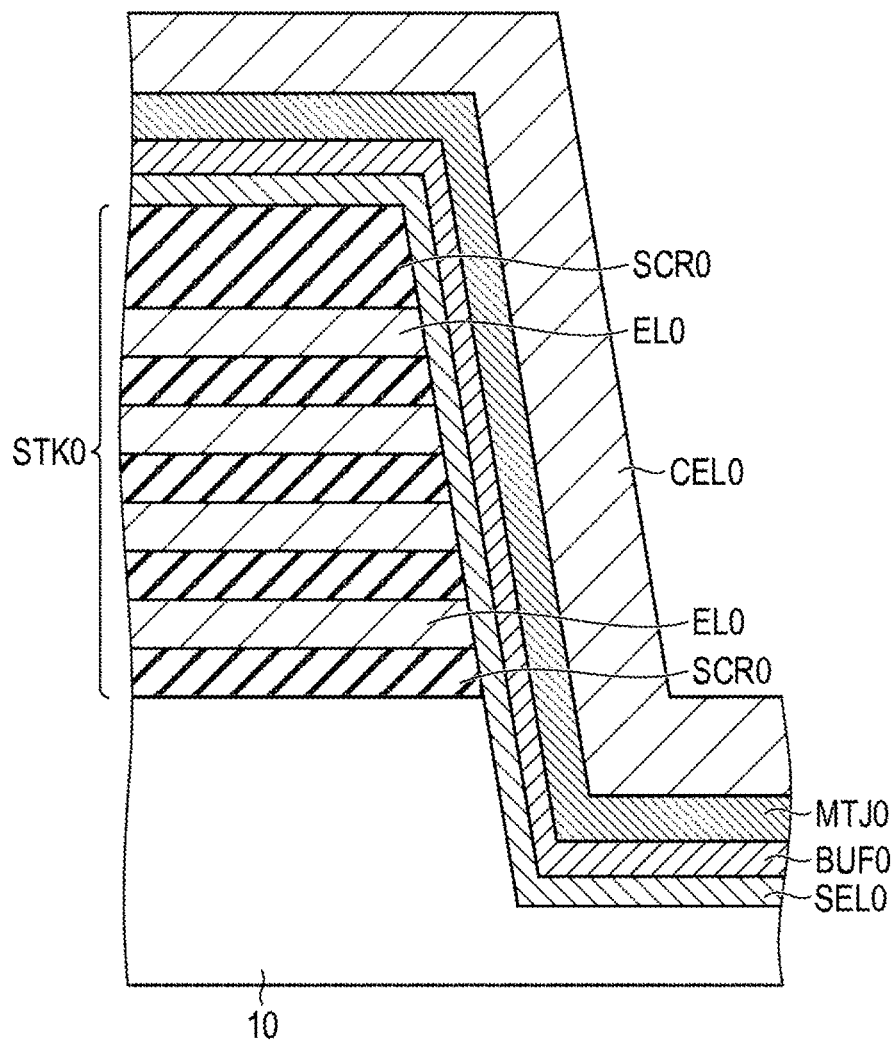

Next, as shown in FIG. 7C, a layer SEL0 for the selector, a layer BUF0 for the buffer, a layer MTJ0 for the magnetoresistance effect element, and a layer CEL0 for the common electrode are formed on the front surface of the patterned stack film STK0 and lower structure 10.

Furthermore, these layers SEL0, BUF0, MTJ0 and CEL0 are patterned. As a result, the structure shown in FIG. 8 is obtained. That is, a pattern of the layer SEL0, the layer BUF0, the layer MTJ0, and the layer CEL0 extending in the X direction can be obtained.

Figure 7D:
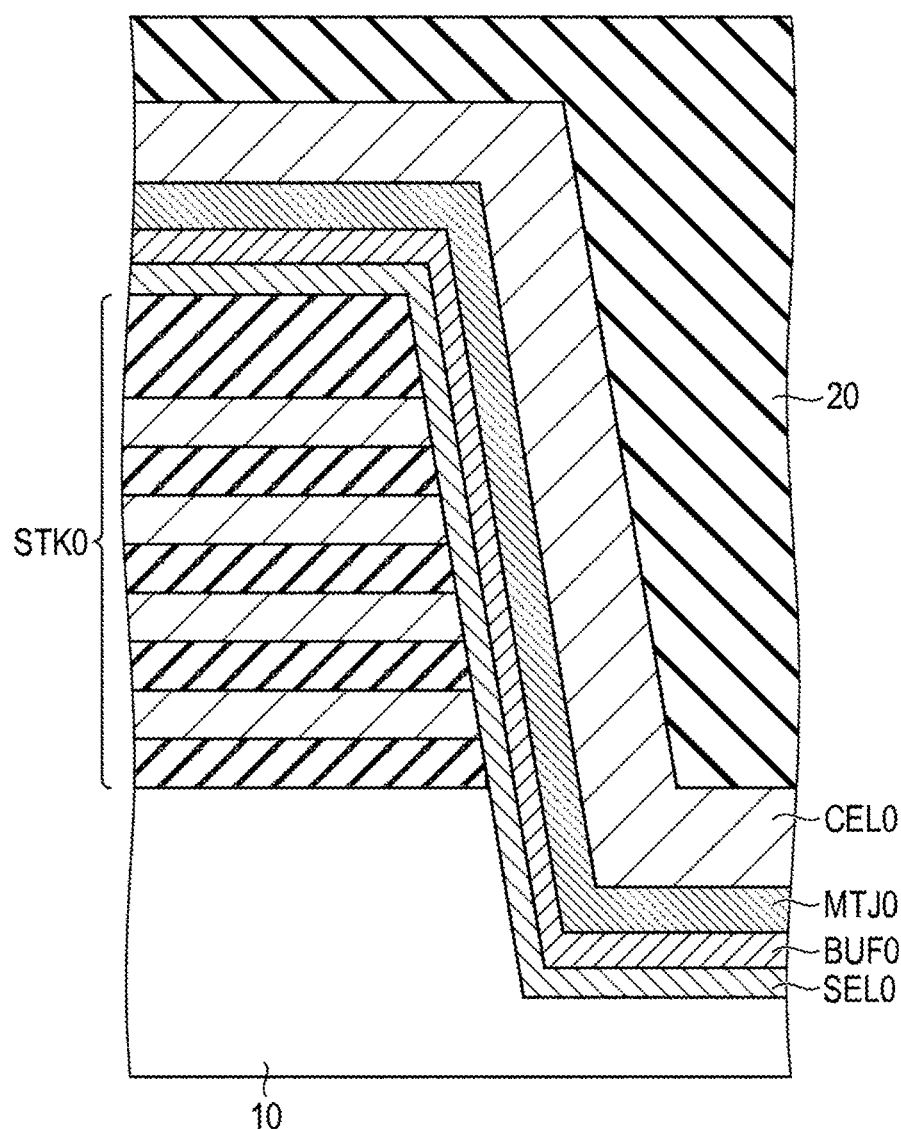

Next, as shown in FIG. 7D, an insulating layer 20 is formed on the entire surface.

Figure 7E:
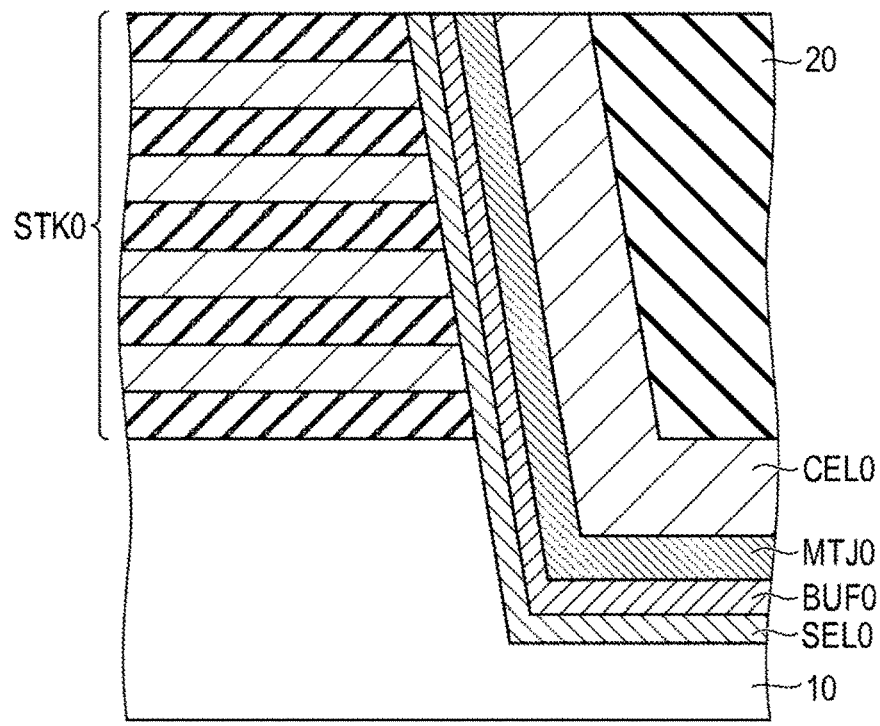

Next, as shown in FIG. 7E, the insulating layer 20, the layer SEL0, the layers BUF0 and MTJ0, and the layer CEL0 are etched back. As a result, the layers are flattened at the upper surface of the patterned stack film STK0.

Figure 7F:
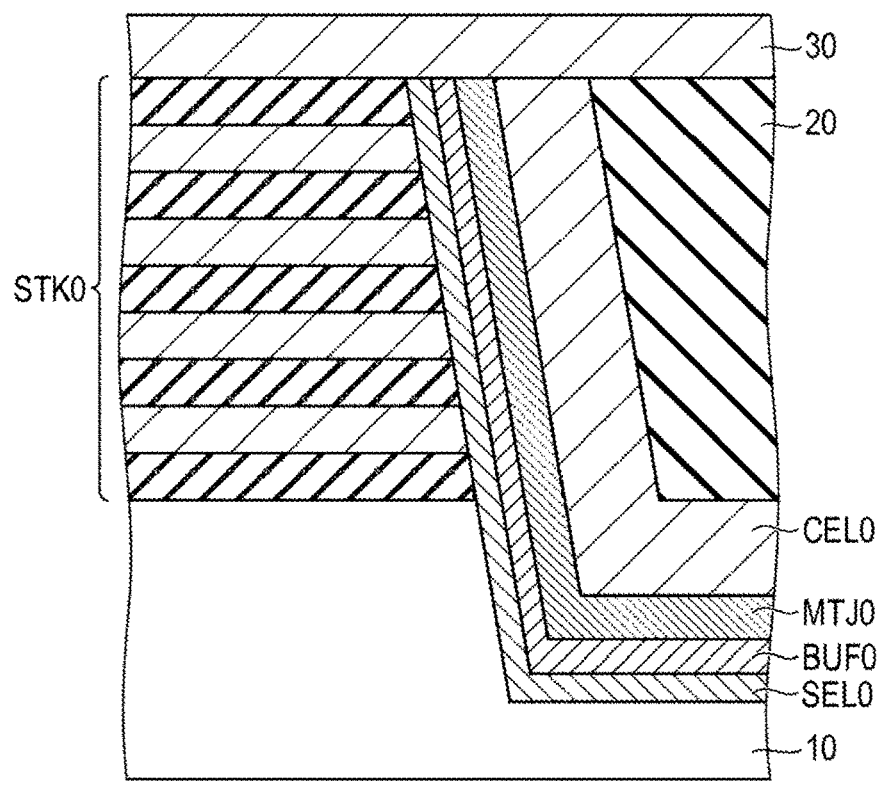

Next, as shown in FIG. 7F, a conductive protection layer 30 is formed on the layers 20, SEL0, BUF0, MTJ0, and CEL0.

Figure 7G:
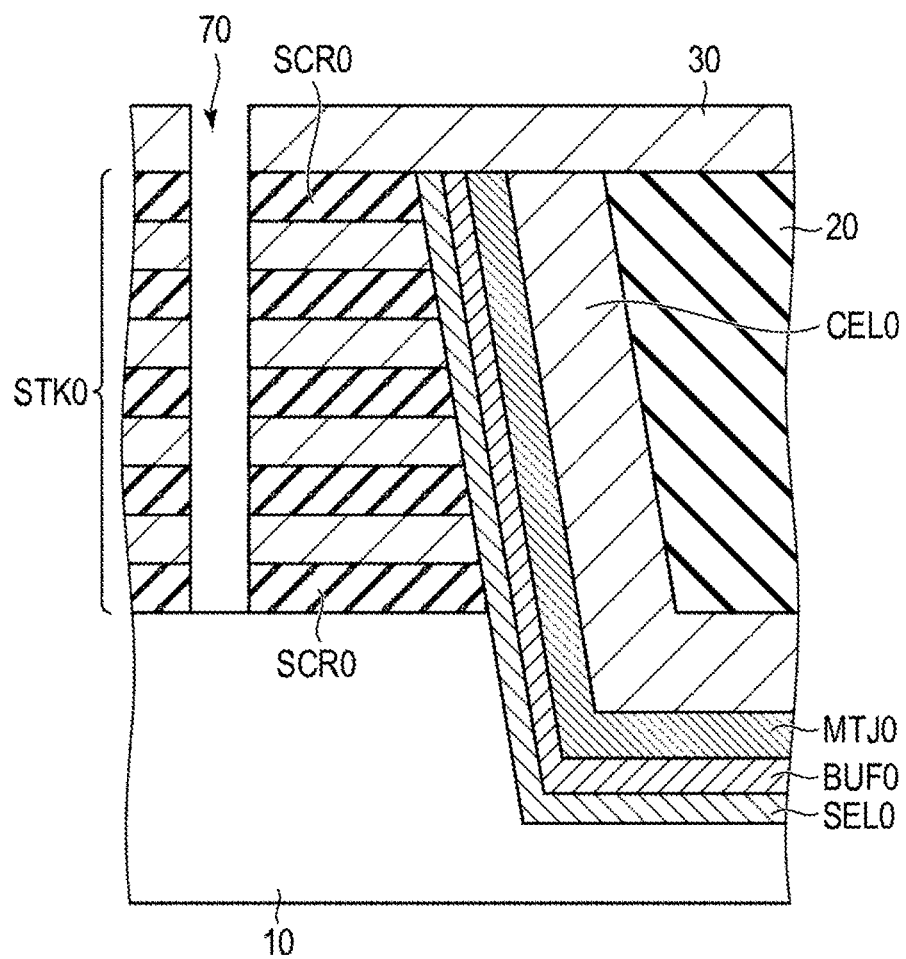

Next, as shown in FIG. 7G, a groove 70 to be used for removing the sacrificial insulating layer SCR0 is formed in the protection layer 30 and the stack film STK0.

Figure 7H:
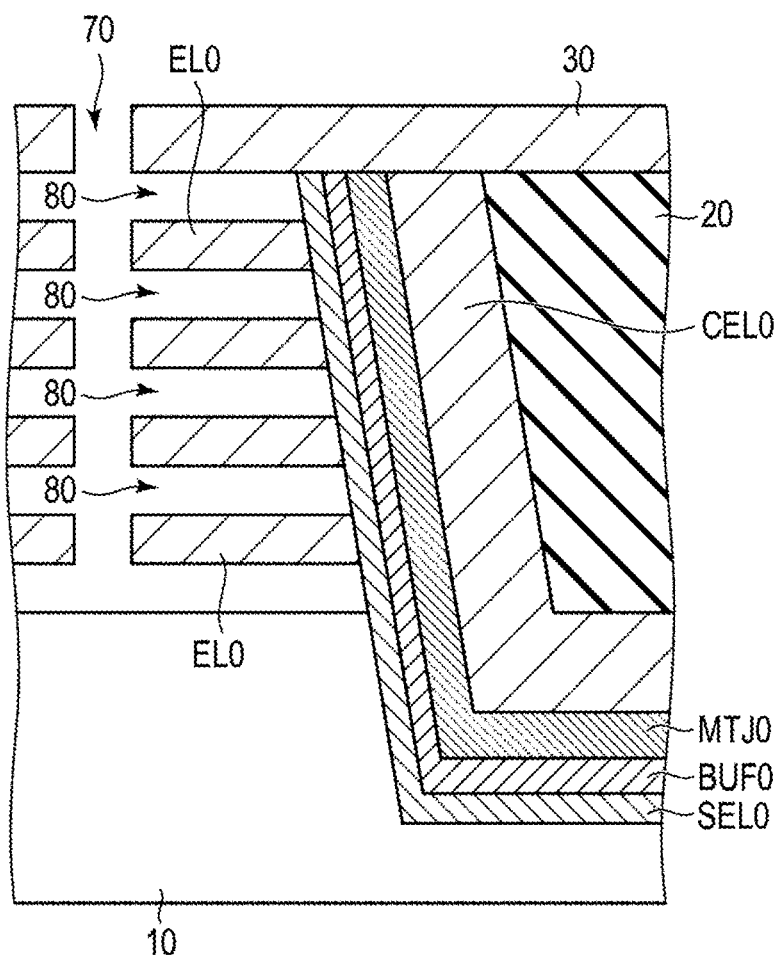

Next, as shown in FIG. 7H, an etching solution is introduced through the groove 70 to perform wet etching of the sacrificial insulating layer SCR0 material. The sacrificial insulating layer SCR0 is selectively removed by the etching solution, and gaps 80 are formed between the electrode layers EL0.

Figure 7I:
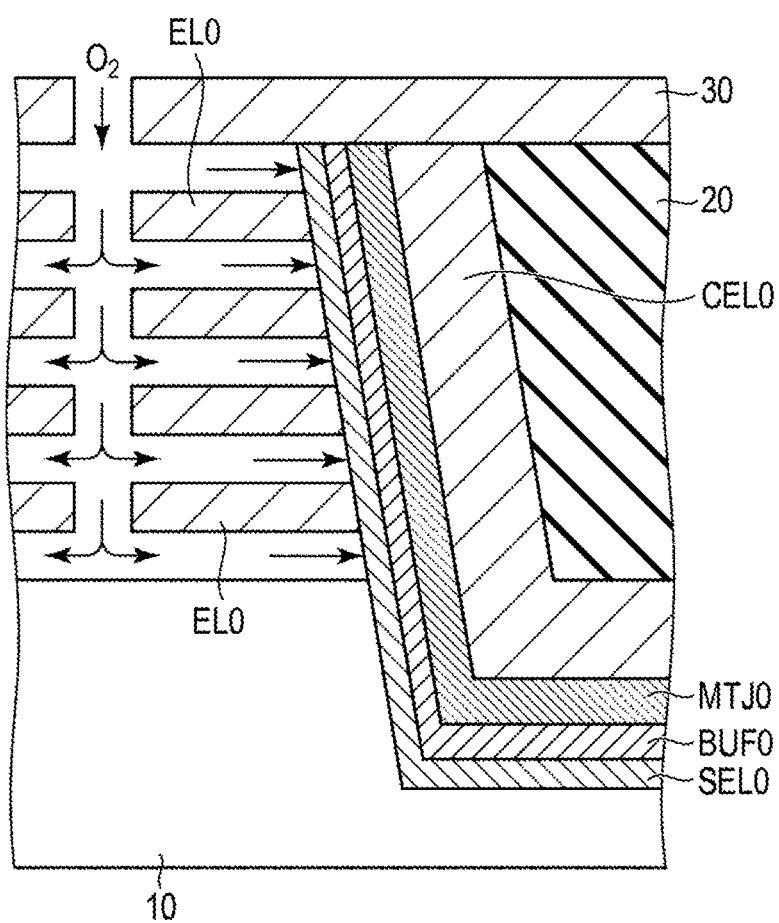

Next, as shown in FIG. 7I, an oxidation treatment is performed by introducing oxygen through the groove 70 and the gaps 80. By performing the oxidation treatment, the layer SEL0, the layer BUF0, and the layer MTJ0 are partially oxidized.

Figure 7J:
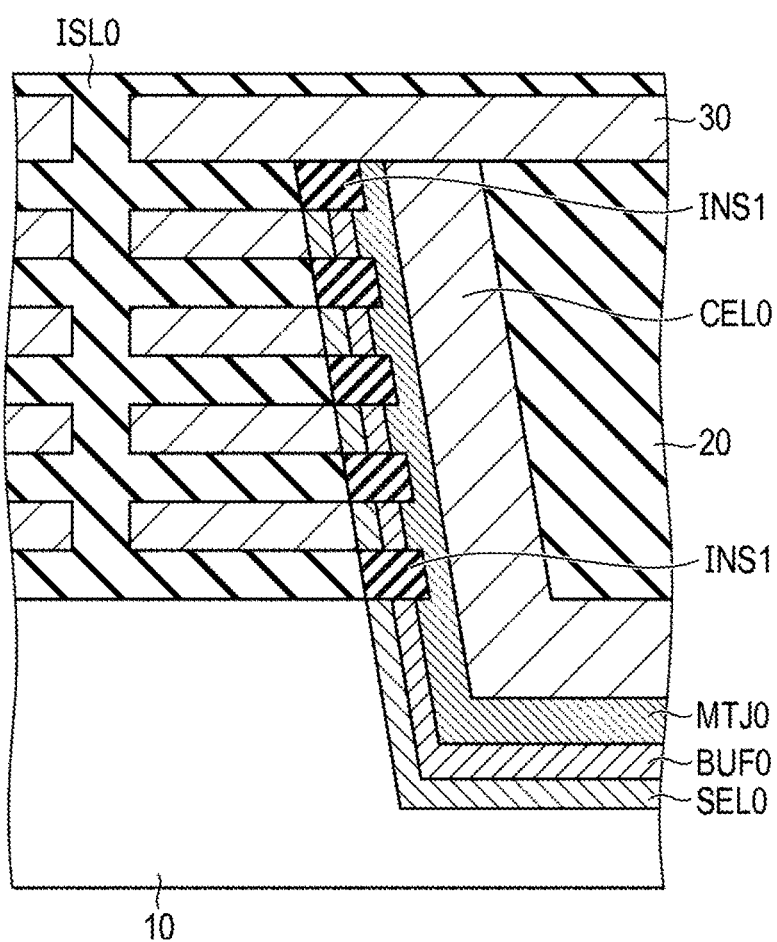

As a result, as shown in FIG. 7J, an insulating portion INS1 is formed in the portion adjacent to each of the gaps 80. Subsequently, insulating layer ISL0 is formed covering the exposed surfaces and filling the groove 70 and the gaps 80. In a subsequent step, the upper surface of the insulating layer ISL0 can be flattened or planarized.

Figure 7K:
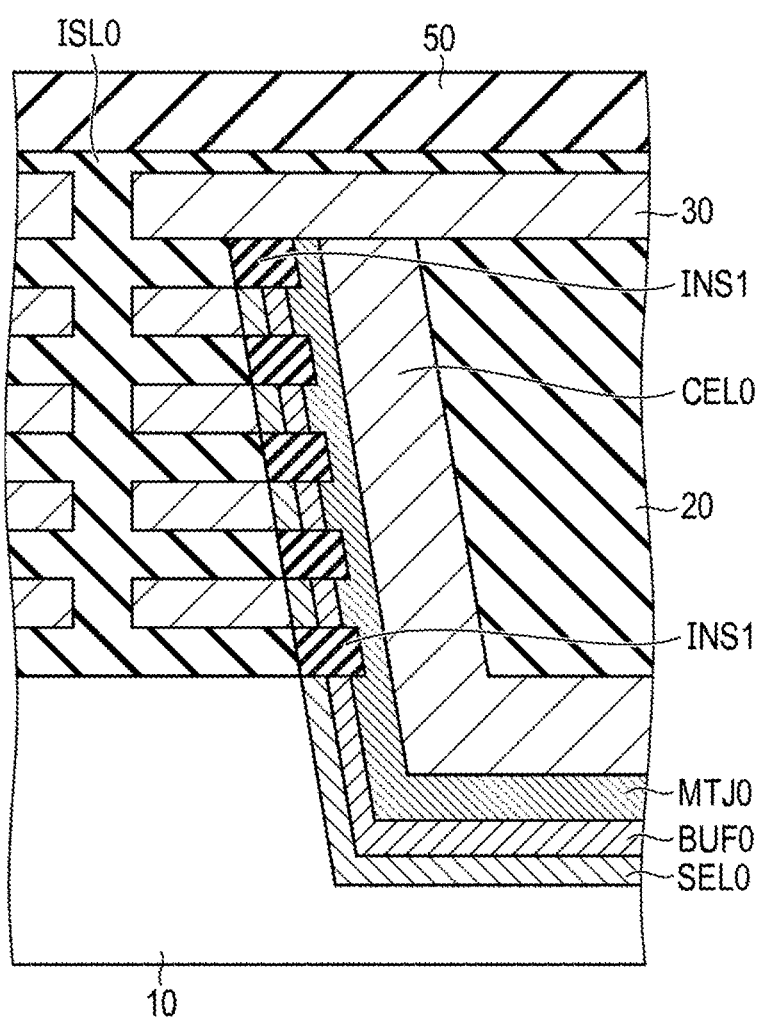

Next, as shown in FIG. 7K, the insulating layer 50 is formed on the insulating layer ISL0.

Figure 7L:
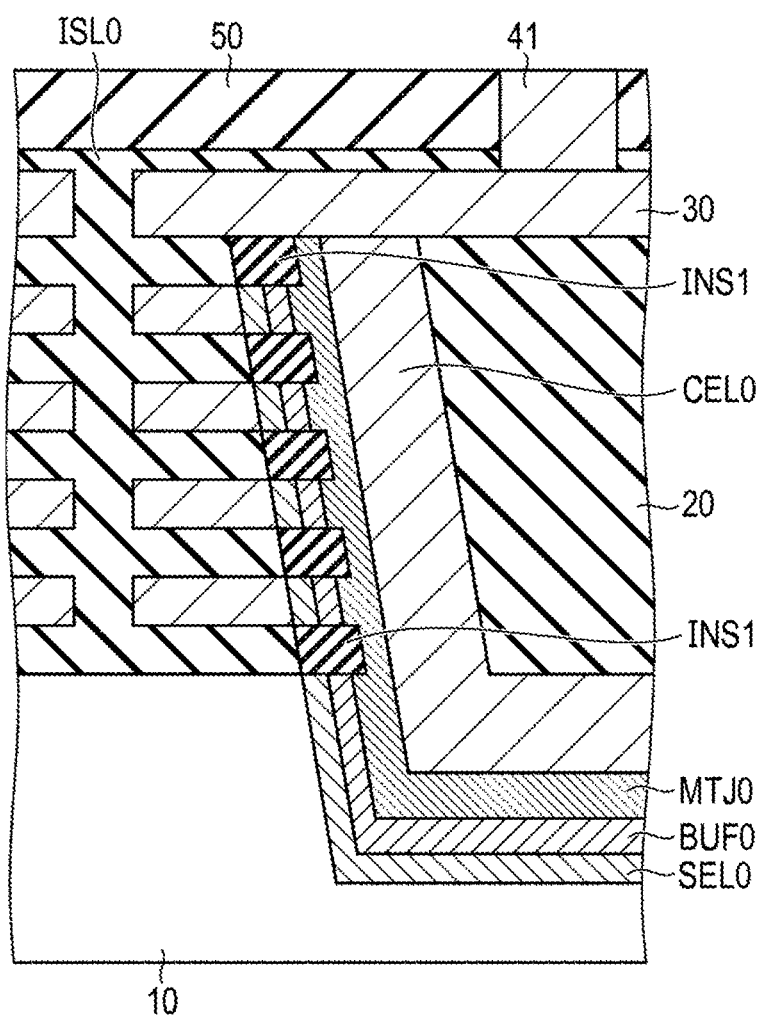

Next, as shown in FIG. 7L, a contact hole is formed in the insulating layer 50 and the insulating layer ISL0, and a contact 41 is formed inside the contact hole.

Figure 7M:
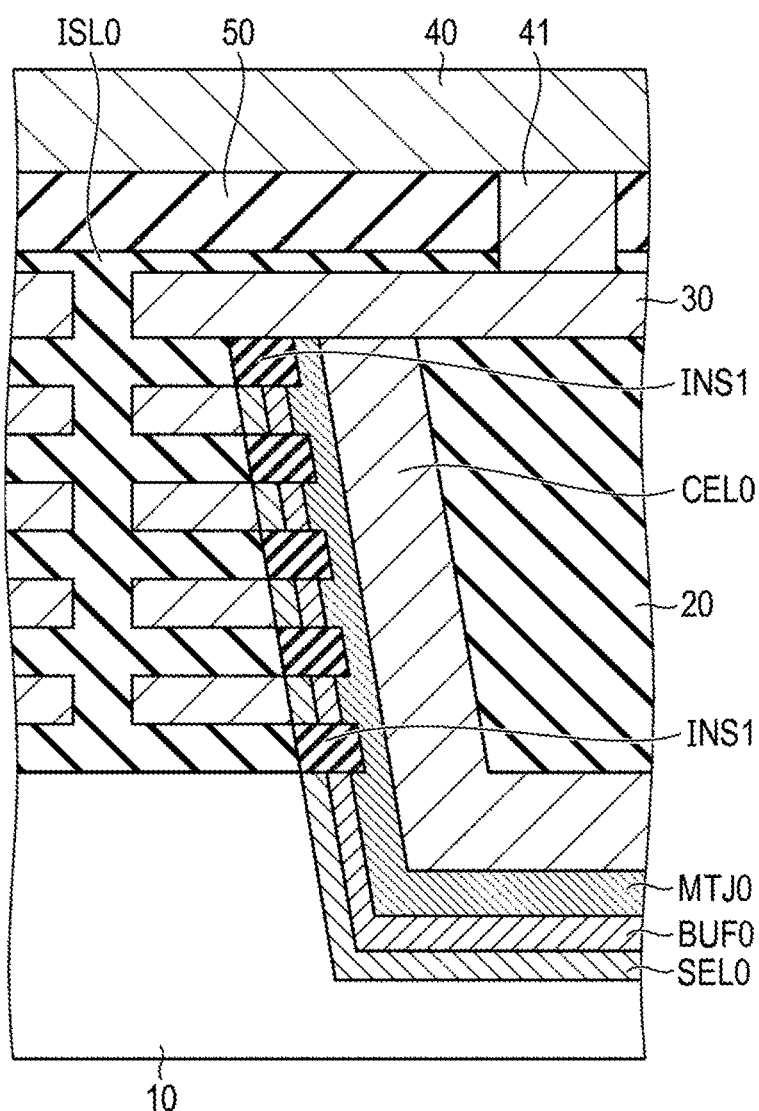

Next, as shown in FIG. 7M, a wiring 40 connected to the contact 41 is formed on the insulating layer 50.

By the manufacturing method as described above, the memory array structure shown in FIG. 6 can be obtained.

According to the manufacturing method described above, by introducing oxygen through the gaps 80 that were obtained by removing the sacrificial insulating layer SCR0, the insulating portion INS1 is formed. In addition, at least a part of the layer MTJ0 is demagnetized by this oxidation treatment. By such demagnetization and insulation material formation, adjacent memory cells can be magnetically and electrically separated from each other, and thus, it is possible to more efficiently form a magnetic storage device having a high degree of integration.

Second Memory Array Configuration

Next, a second memory array configuration for the magnetic storage device will be described. That is, memory structure units MEMU described above are arranged in an array according to the second memory array configuration will be described. The basic structure is the same as the first memory array configuration described above. Therefore, the descriptions of the elements or aspects the same as in the first memory array configuration may be omitted.

Figure 9:
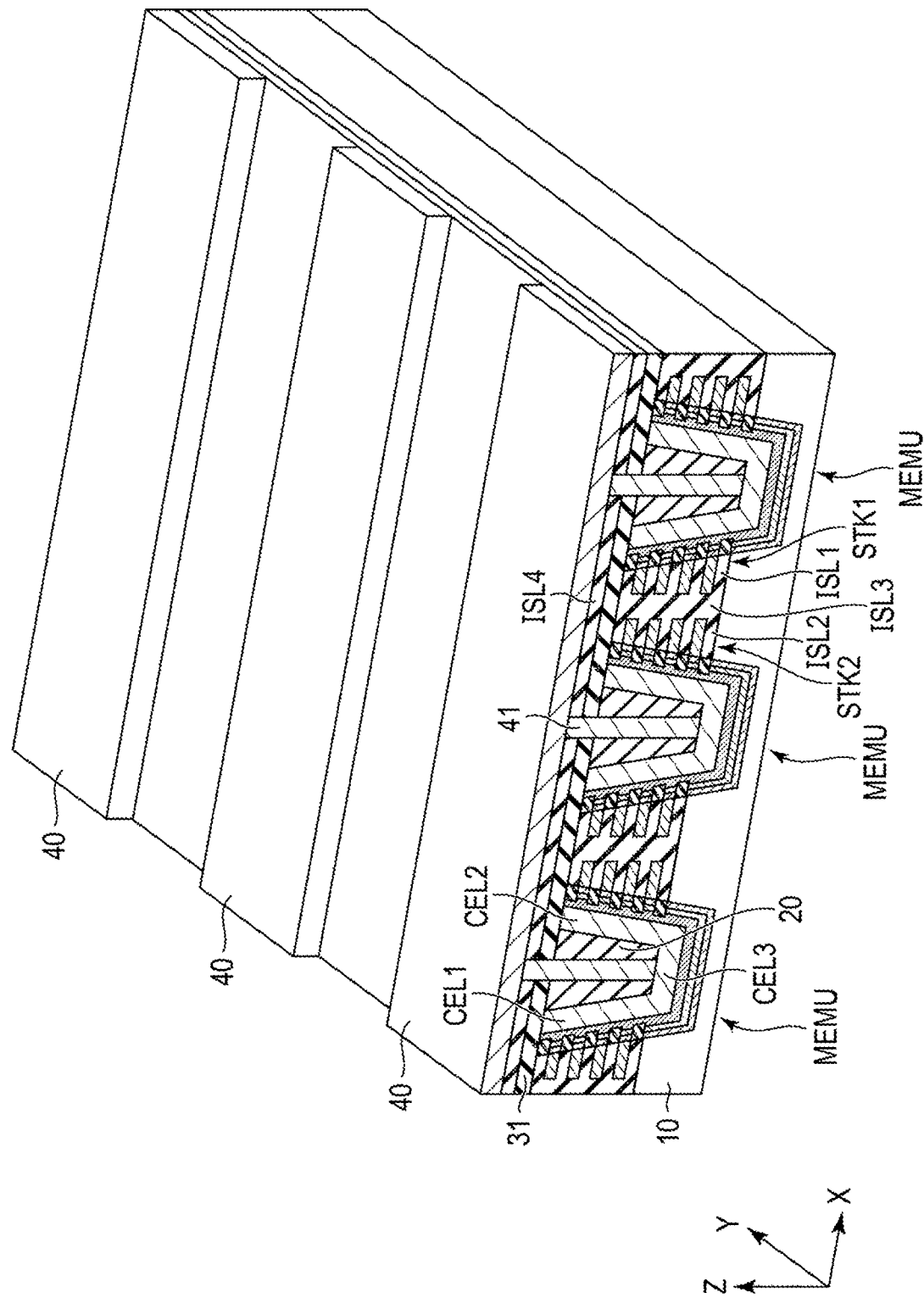
FIG. 9 is a schematic perspective view of a second memory array configuration of a magnetic storage device.

FIG. 9 is a schematic perspective view of the magnetic storage device having the second memory array configuration.

In the first memory array configuration, the protection layer 30 is formed of conductive material. In the second configuration example, the protection layer 31 is formed of insulating material. Therefore, the contact 41 penetrates the insulating protection layer 31 and the insulating layer 20, and is connected to the third common electrode portion CEL3. Therefore, the first common electrode portion CEL1, the second common electrode portion CEL2, and the third common electrode portion CEL3 (collectively the common electrode layers) in a plurality of memory structure units MEMU arrayed in the X direction are electrically connected in common to the wiring 40 and the contact 41. Other configurations are the same as the first memory array configuration described above.

Next, a method of manufacturing the magnetic storage device having the aforementioned memory array configuration will be described with reference to the cross-sectional views schematically shown in FIG. 10A to FIG. 10G.

First, similarly to the first memory array configuration, the processes shown in FIG. 7A through FIG. 7E are performed.

Figure 10A:
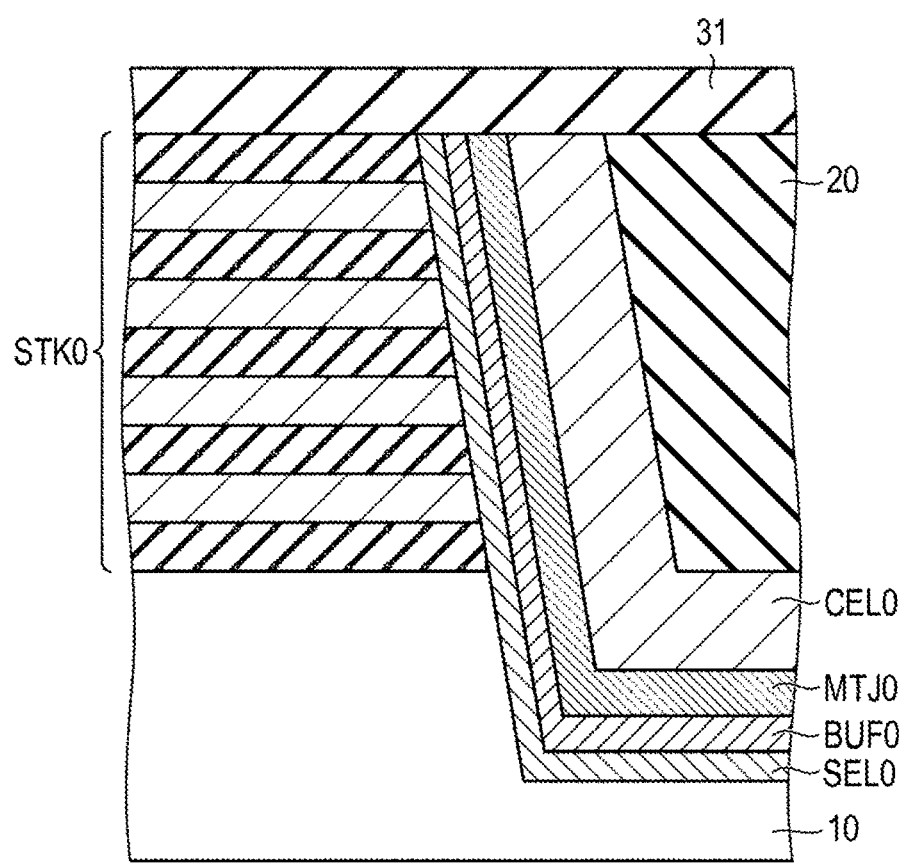
FIG. 10A through FIG. 10G are schematic cross-sectional views illustrating aspects of a method of manufacturing a magnetic storage device having a second memory array configuration.

Next, as shown in FIG. 10A, an insulating protection layer 31 is formed on the insulating layer 20, the layer SEL0, the layer BUF0, the layer MTJ0, and the layer CEL0.

Figure 10B:
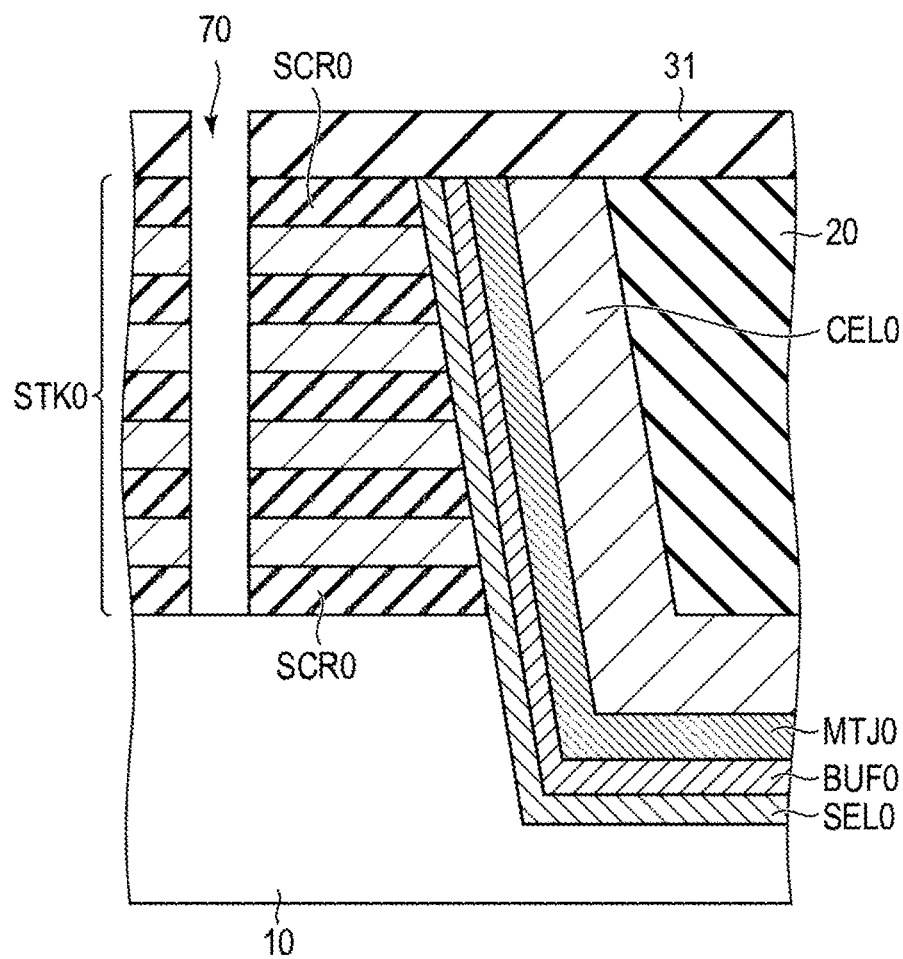

Next, as shown in FIG. 10B, a groove 70 to be used for removing the sacrificial insulating layer SCR0 is formed in the protection layer 31 and the stack film STK0.

Figure 10C:
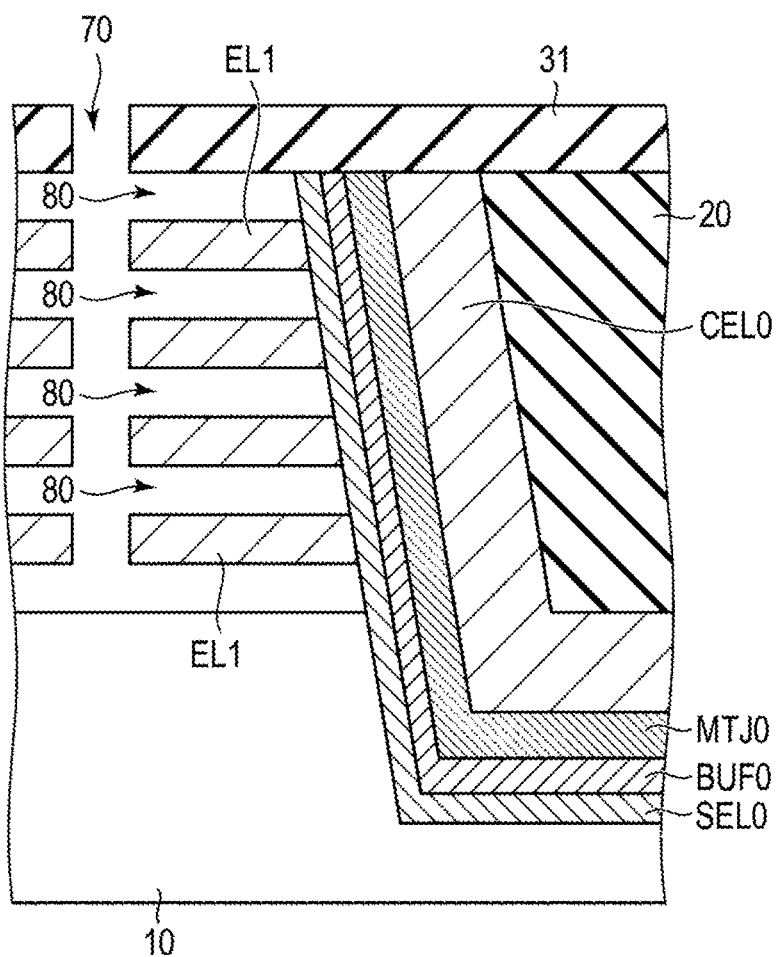

Next, as shown in FIG. 10C, an etching solution is introduced through the groove 70 to perform wet etching of the sacrificial insulating layer SCR0. The wet etching selectively removes the sacrificial insulating layer SCR0, and gaps 80 are formed between the electrode layers EL0.

Figure 10D:
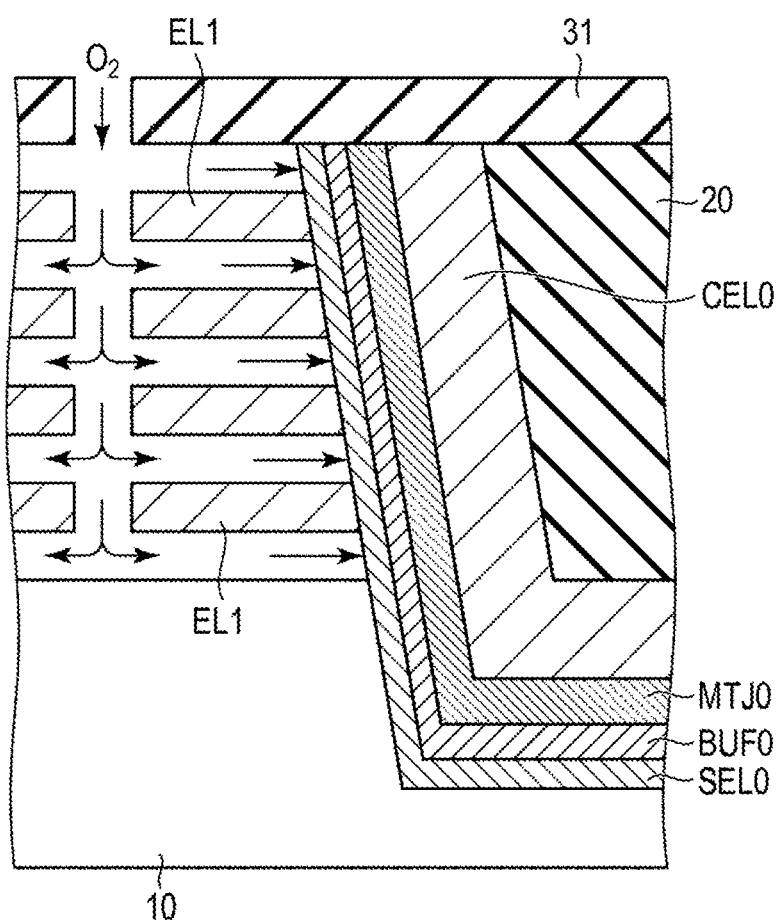

Next, as shown in FIG. 10D, the oxidation treatment is performed by introducing oxygen through the groove 70 and the gaps 80. By performing the oxidation treatment, the layers SEL0, BUF0, and MTJ0 are partially oxidized.

Figure 10E:
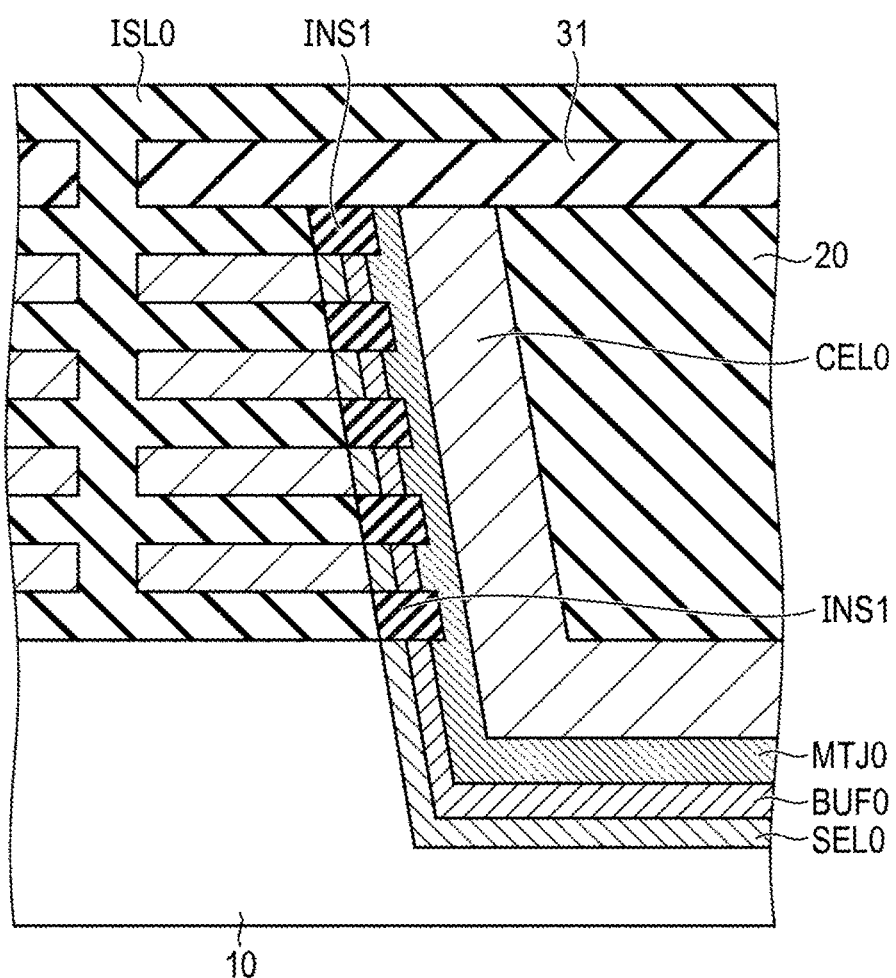

As a result, as shown in FIG. 10E, an insulating portion INS1 is formed in the portion adjacent to each of the gaps 80. Subsequently, an insulating layer ISL0 is covers the exposed surfaces, and fills the groove 70 and the gaps 80. Subsequently, the upper surface of the insulating layer ISL0 can be planarized.

Figure 10F:
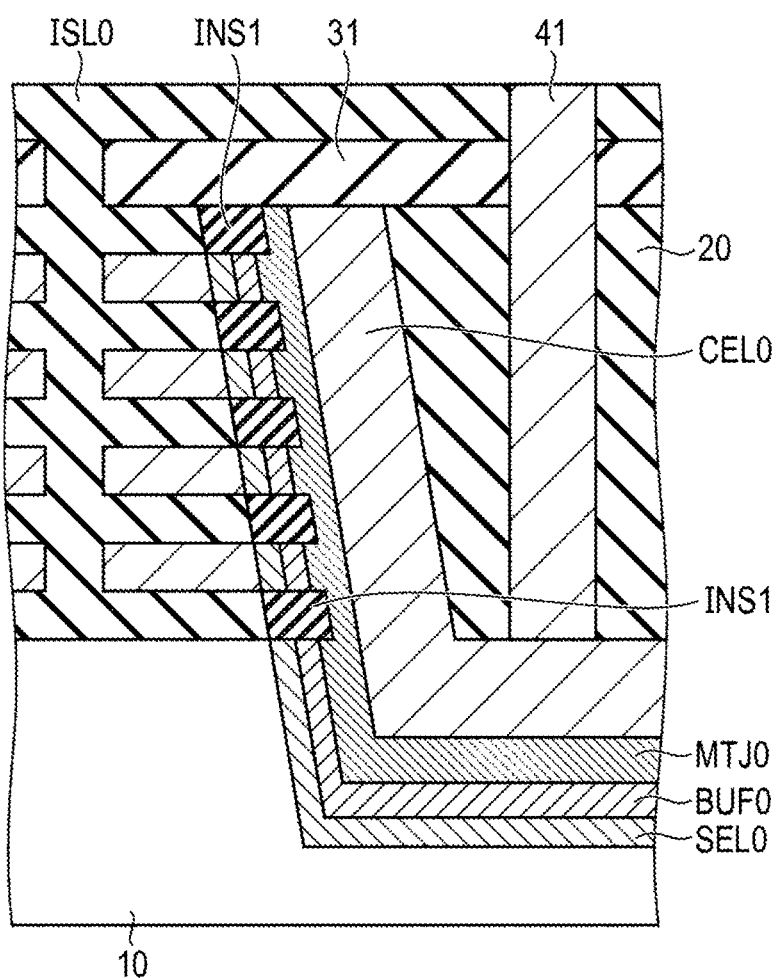

Next, as shown in FIG. 10F, a contact hole is formed through the insulating layer ISL0, the protection layer 31, and the insulating layer 20, and a contact 41 is then formed inside the contact hole.

Figure 10G:
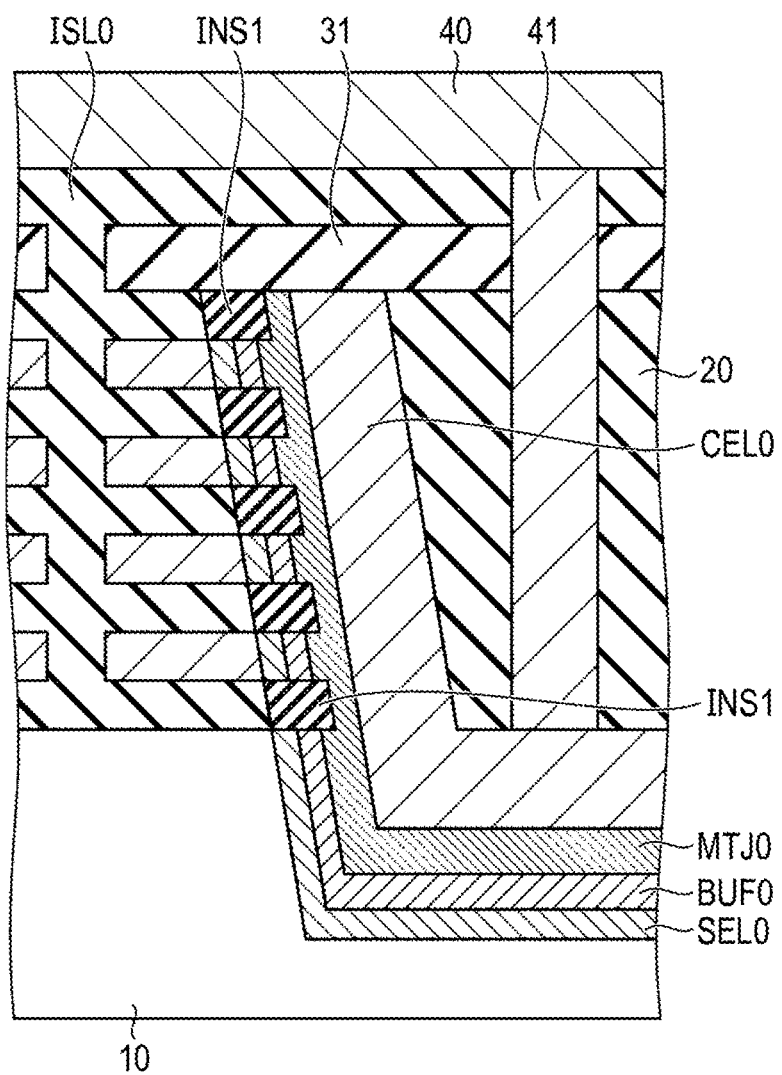

Next, as shown in FIG. 10G, a wiring 40 connected to the contact 41 is formed on the insulating layer ISL0.

By the manufacturing method described above, the memory array structure shown in FIG. 9 can be obtained.

As described above, similar to the manufacturing method for the first memory array configuration, the adjacent memory cells can be magnetically and electrically separated from one another, and thus, it is possible to more efficiently form a magnetic storage device having a high degree of integration.

Third Memory Array Configuration

Next, a third memory array configuration for the magnetic storage device will be described. That is, a plurality of memory structure units MEMU described above are arranged in an array according to the third memory array configuration will be described. The basic structure is the same as the first memory array configuration described above. Therefore, the descriptions of the elements in the first memory array configuration may be omitted.

Figure 11:
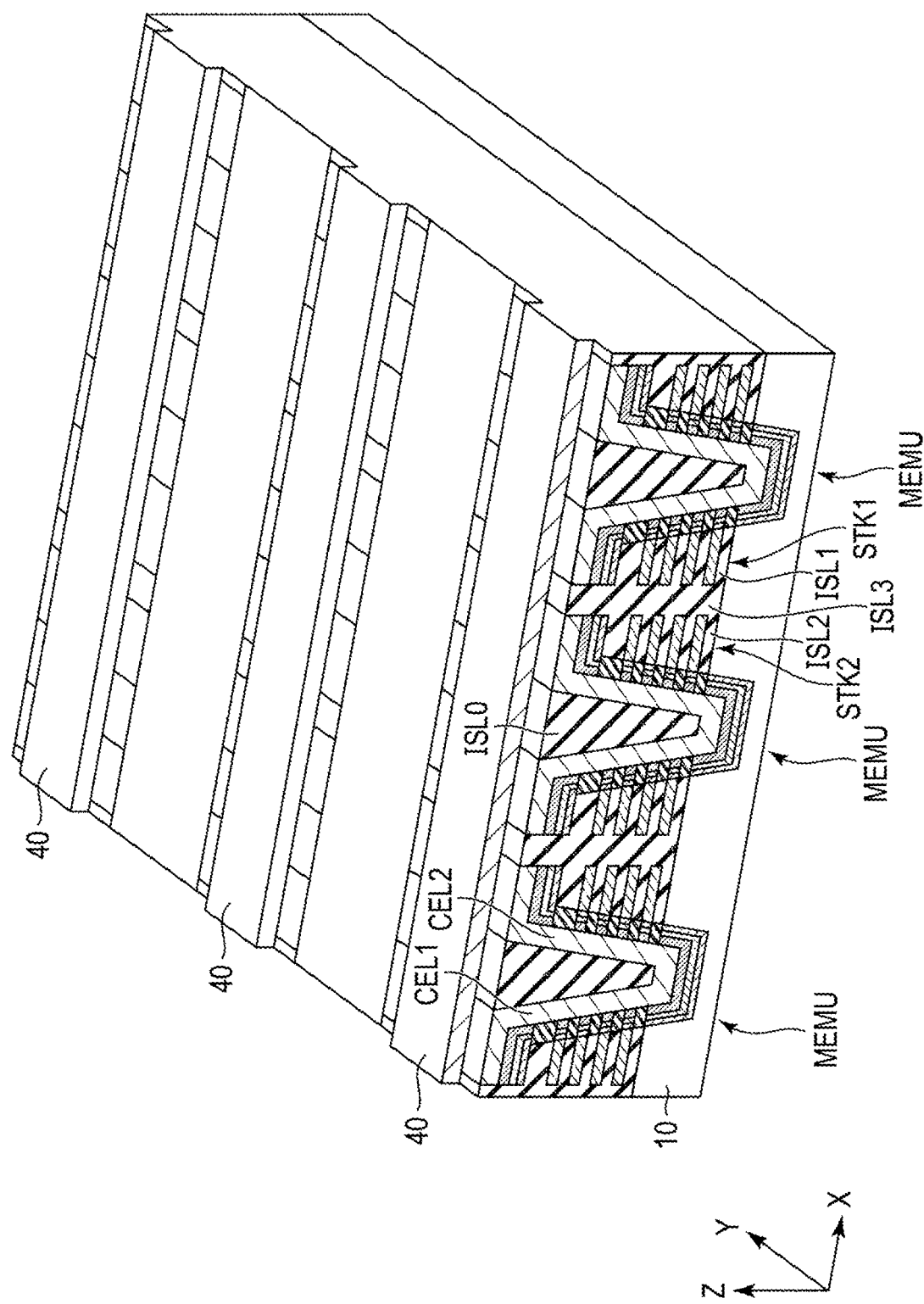
FIG. 11 is a schematic perspective view of a magnetic storage device having a third memory array configuration.

FIG. 11 is a schematic perspective view of the magnetic storage device having the third memory array configuration.

Here, the wiring 40 is directly connected to the first common electrode portion CEL1 and the second common electrode portion CEL2 without a contact. Therefore, the first common electrode portion CEL1, the second common electrode portion CEL2, and the third common electrode portion CEL3 in the plurality of memory structure units MEMU arrayed in the X direction are electrically connected by a wiring 40. Other configurations are the same as the first memory array configuration described above.

Next, a method of manufacturing the magnetic storage device having the aforementioned memory array configuration will be described with reference to the cross-sectional views schematically shown in FIG. 12A to FIG. 12E.

First, similarly to the first memory array configuration, the processes shown in FIG. 7A through FIG. 7C and FIG. 8 are performed.

Figure 12A:
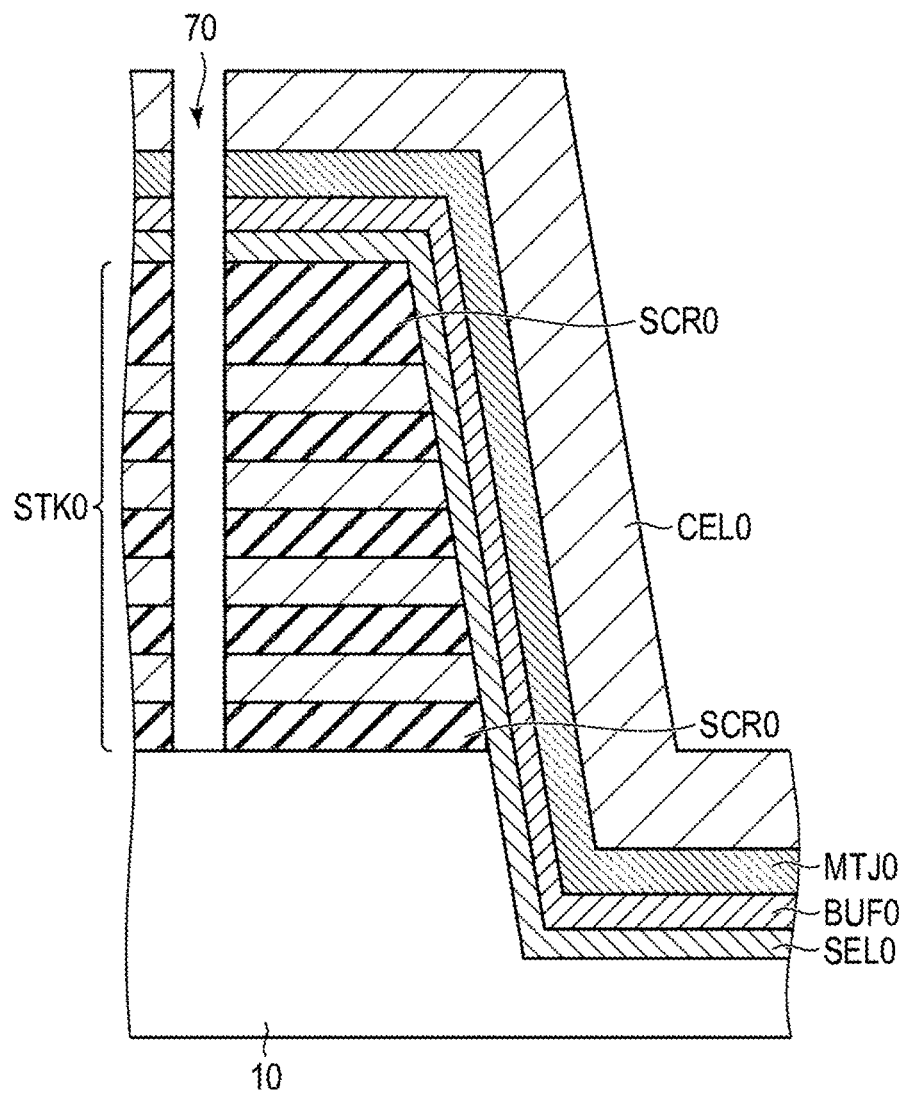
FIG. 12A through FIG. 12E are schematic cross-sectional views illustrating aspects of a method of manufacturing a magnetic storage device having a third memory array configuration.

Next, as shown in FIG. 12A, a groove 70 for removing the sacrificial insulating layer SCR0 is formed in the layer CEL0 for the common electrode, the layer MTJ0 for the magnetoresistance effect element, the layer BUF0 for the buffer, the layer SEL0 for the selector, and the stack film STK0.

Figure 12B:
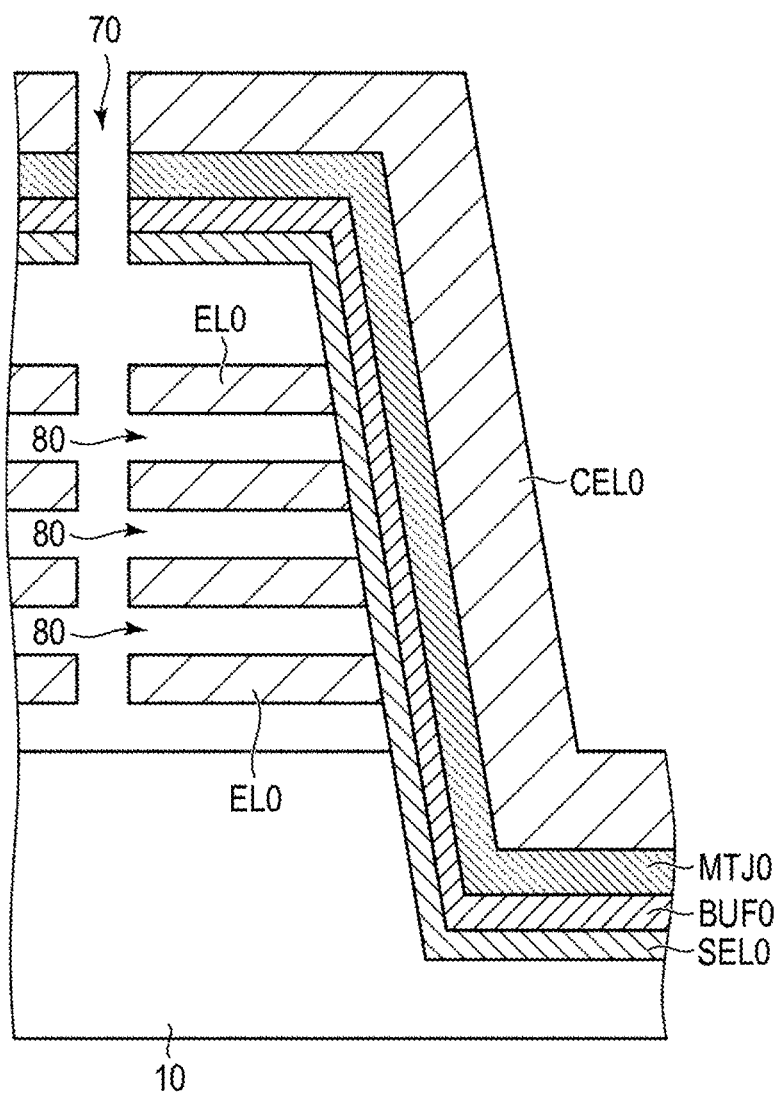

Next, as shown in FIG. 12B, an etching solution is introduced through the groove 70 to perform selective wet etching of the sacrificial insulating layer SCR0 to form gaps 80 between the electrode layers EL0.

Figure 12C:
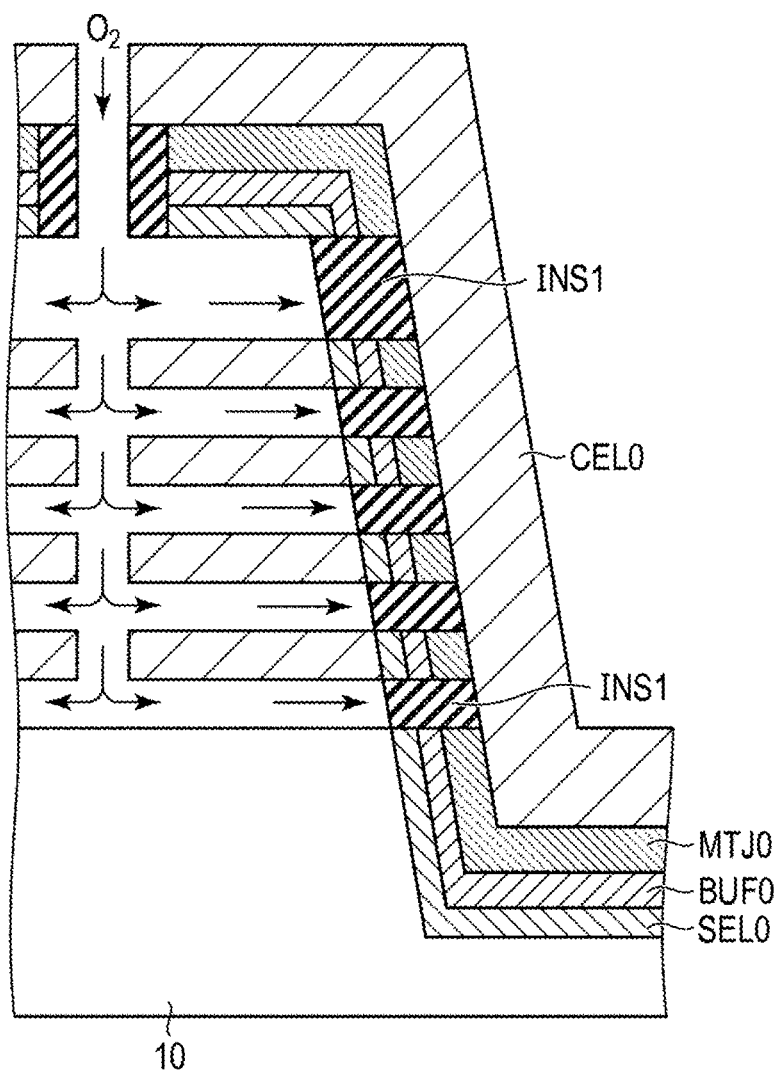

Next, as shown in FIG. 12C, the oxidation treatment is performed by introducing oxygen through the groove 70 and the gaps 80. By performing the oxidation treatment, the layers SEL0, BUF0, and MTJ0 are partially oxidized. As a result, an insulating portion INS1 is formed in the portion adjacent to each of the gaps 80.

Figure 12D:
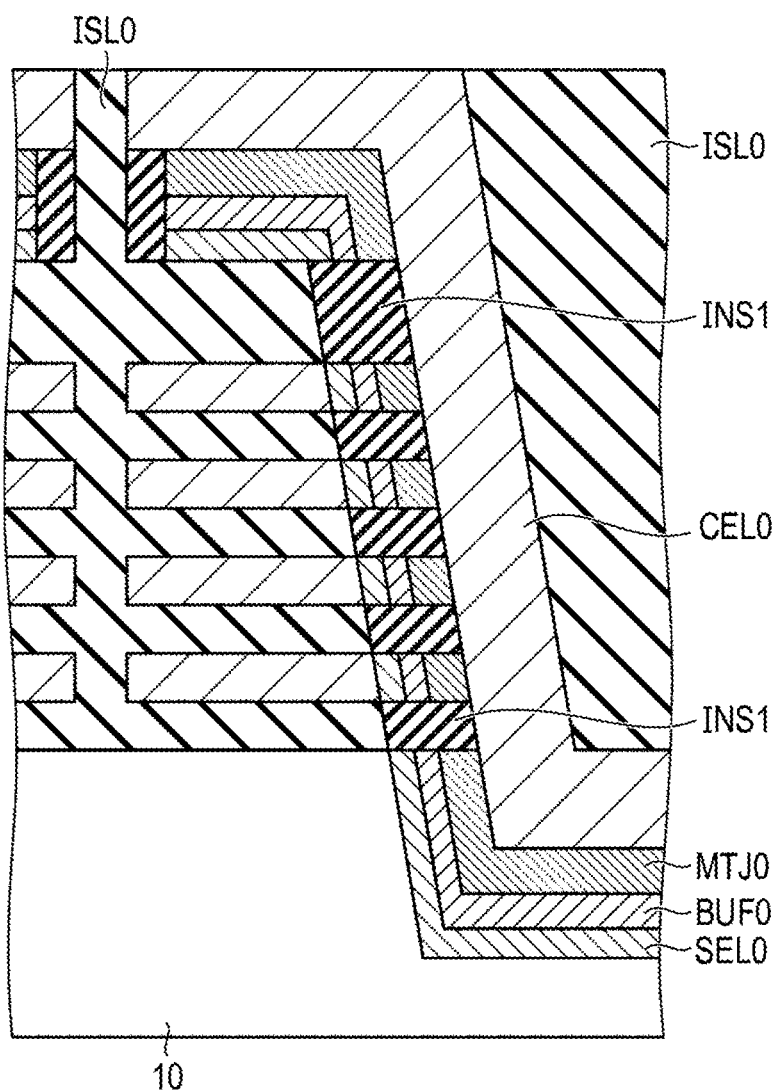

Next, as shown in FIG. 12D, an insulating layer ISL0 is formed on the exposed surfaces, and the groove 70 and the gaps 80 are filled with the insulating layer ISL0. Subsequently, the insulating layer ISL0 is etched back or polished from the upper surface to expose a portion of the electrode layer CEL0.

Figure 12E:
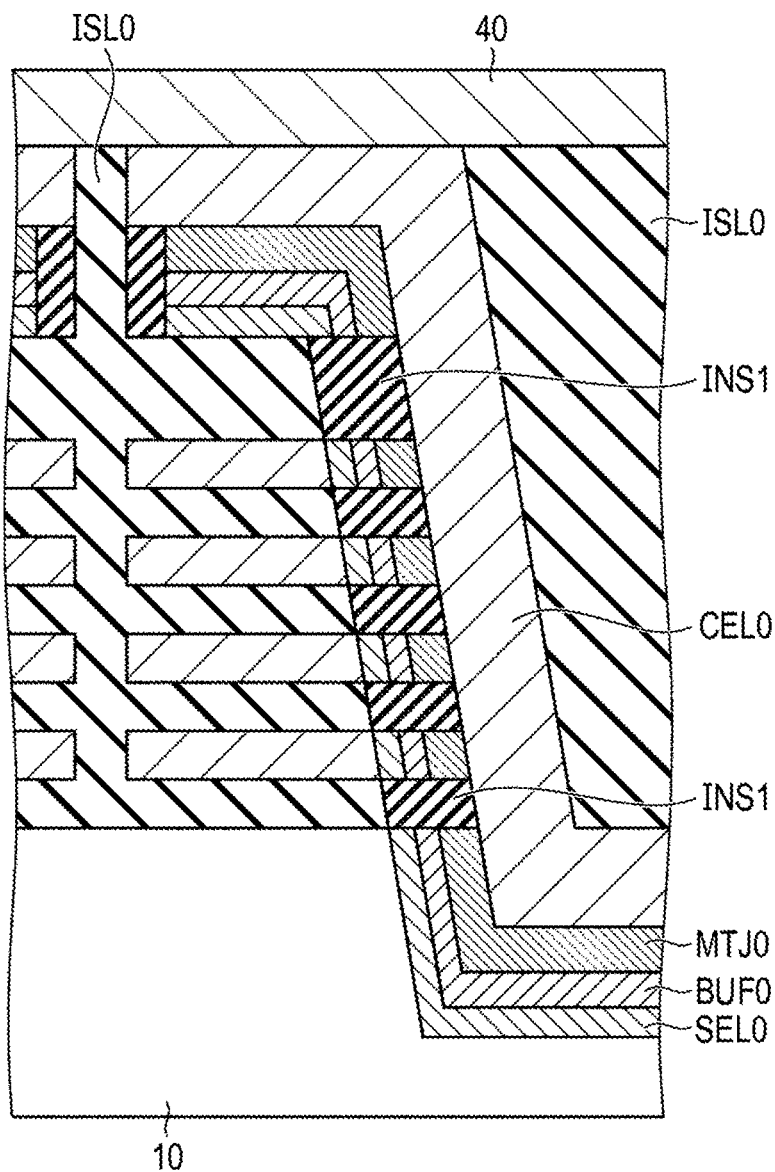

Next, as shown in FIG. 12E, a wiring 40 is formed that is directly connected to the exposed electrode layer CEL0.

By the manufacturing method described above, the memory array structure shown in FIG. 11 can be obtained.

As described above, similar to the manufacturing method for the first memory array configuration, the adjacent memory cells can be magnetically and electrically separated from each other, and thus, it is possible to more efficiently form a magnetic storage device having a high degree of integration.

In the first, second and third memory array configurations described above, the layer BUF0 is provided on the layer SEL0, and the layer MTJ0 is provided on the layer BUF0. Alternatively, the layer BUF0 may be provided on the layer MTJ0, and the layer SEL0 for may be provided on the layer BUF0.

The layers BUF0, BUF1, and BUF2 are used for buffers in the above examples. However, in some examples, these layers need not be provided.

In the above examples, the insulating portion INS1, the insulating portion INS2, and the demagnetized portion NMG1 are formed by an oxidation process. Alternatively, in other examples, the insulating portion INS1, the insulating portion INS2, and the demagnetized portion NMG1 may be formed by a nitriding process.

In the above examples, the insulating portion INS1, the insulating portion INS2, and the demagnetized portion NMG1 are formed by an oxidation process or reaction. However, in other examples, the insulating portion INS1, the insulating portion INS2, and the demagnetized portion NMG1 may be formed by other processes or reactions.

In other examples, the insulating portion INS1, the insulating portion INS2, and the demagnetized portion NMG1 may comprise an air gap structure formed due to the gap formation process.

In addition, the first storage layer portion SL1 can be any ferromagnetic material showing a magnetoresistance effect.

The first reference layer portion RL1 can be formed by any ferromagnetic material showing a magnetoresistance effect or a combination of materials containing a ferromagnetic material may be used.

The first tunnel barrier layer portion BL1 can be formed of any tunnel barrier material having a magnetoresistance effect.

In addition, any of the first, second, third and fourth examples shown in FIGS. 2, 3, 4 and 5, may be used as a memory cell array in any configurations described above.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A magnetic storage device, comprising:
   a semiconductor substrate,
   a first memory structure that includes:
      a first stacked structure in which a plurality of first electrode layers and a plurality of first insulating layers are alternately stacked in a first direction that is perpendicular to the semiconductor substrate, the first electrode layers and the first insulating layers extending in a second direction that is perpendicular to the first direction,
      a first common electrode that extends in the first direction when viewed from the second direction, and
      a first intermediate structure that is disposed between a side surface of the first stacked structure in the second direction and a side surface of the first common electrode in the second direction and includes a plurality of first element portions and a plurality of first non-element portions that are alternately stacked in the first direction, wherein each of the first element portions includes a first magnetoresistance effect element that includes:
a first variable magnetization portion having a variable magnetization direction,
a first fixed magnetization portion having a fixed magnetization direction, and
a first tunnel barrier layer between the first variable magnetization portion and the first fixed magnetization portion, wherein the first variable magnetization portion, the first tunnel barrier layer, and the first fixed magnetization portion being are stacked in the second direction, and each of the first non-element portions includes:
a first demagnetized portion adjacent to the first variable magnetization portion of one of the first element portions that is adjacent thereto in the first direction, and
an insulating portion adjacent to the first demagnetized portion in the second direction.

2. The magnetic storage device according to claim 1, wherein the insulating portion of each of the first non-element portions is in contact with a corresponding one of the first insulating layers.

3. The magnetic storage device according to claim 1, wherein each of the first element portions further includes a first switching element electrically connected to the first magnetoresistance effect element and arranged with respect to the first magnetoresistance effect element in the second direction.

4. The magnetic storage device according to claim 3, wherein the first switching element is between the first magnetoresistance effect element and a corresponding first electrode layer.

5. The magnetic storage device according to claim 3, wherein the first magnetoresistance effect element is between the first switching element and a corresponding first electrode layer.

6. The magnetic storage device according to claim 5, wherein the first demagnetized portion is insulated.

7. The magnetic storage device according to claim 5, wherein each of the first non-element portions includes an insulated portion adjacent to the first fixed magnetization portion of one of the first element portions that is adjacent in the first direction.

8. The magnetic storage device according to claim 3, wherein each of the first element portions further includes a first buffer portion between the first magnetoresistance effect element and the first switching element.

9. The magnetic storage device according to claim 1, further comprising:
a second memory structure that includes:
a second stacked structure in which a plurality of second electrode layers and a plurality of second insulating layers are alternately stacked in the first direction, the second electrode layers and the second insulating layers extending along in the second direction,
a second common electrode that extends in the first direction when viewed from the second direction, and
a second intermediate structure that is disposed between a side surface of the second stacked structure in the second direction and a side surface of the second common electrode in the second direction and includes a plurality of second element portions and a plurality of second non-element portions that are alternately stacked in the first direction, wherein each of the second element portions includes a second magnetoresistance effect element that includes:
a second variable magnetization portion having a variable magnetization direction,
a second fixed magnetization portion having a fixed magnetization direction, and
a second tunnel barrier layer between the second variable magnetization portion and the second fixed magnetization portion, the second variable magnetization portion, the second tunnel barrier layer, and the second fixed magnetization portion being stacked in the second direction, and each of the second non-element portions includes a second demagnetized portion adjacent to the second variable magnetization portion of one of the second element portions that is adjacent thereto in the first direction.

10. The magnetic storage device according to claim 9, wherein the first stacked structure, the first intermediate structure, the first common electrode, the second common electrode, the second intermediate structure, and the second stacked structure are arranged along in the second direction.

11. The magnetic storage device according to claim 9, further comprising:
a third intermediate structure and a third common electrode in the semiconductor substrate, wherein
the first intermediate structure and the second intermediate structure are connected via the third intermediate structure, and
the first common electrode and the second common electrode are electrically connected via the third common electrode.

12. The magnetic storage device according to claim 9, wherein a plurality of memory units, each of which includes the first and second memory structures arranged along in the second direction, are arrayed in the second direction and a third direction intersecting the first and second directions.

13. The magnetic storage device according to claim 12, further comprising:
an intermediate insulating portion formed of the same insulating material as the first and second insulating layers and interposed between the first stacked structure of the first memory structure of one of the memory units and the second stacked structure of the second memory structure of another of the memory units that is adjacent to said one of the memory units in the second direction.

14. The magnetic storage device according to claim 12, wherein the first stacked structure of each of two of the memory units adjacent in the third direction is connected via a first extending portion, and the second stacked structure of each of two of the memory units adjacent in the third direction is connected via a second extending portion.

15. The magnetic storage device according to claim 1, wherein
a lower surface of the first stacked structure that is connected to the side surface thereof contacts the semiconductor substrate in the first direction.

16. A magnetic storage device, comprising:
a first stacked structure in which a plurality of first electrode layers and a plurality of first insulating layers are alternately stacked in a stacking direction, the first electrode layers and the first insulating layers extending along an extension direction that is perpendicular to the stacking direction, a first common electrode that extends in the stacking direction when viewed from the extension direction, and a first intermediate structure that is between the first stacked structure and the first common electrode and includes a plurality of first element portions and a plurality of first non-element portions that are alternately stacked in the stacking direction, and a wiring that extends in the extension direction, wherein each of the first element portions includes a first magnetoresistance effect element that includes:

a first variable magnetization portion having a variable magnetization direction, a first fixed magnetization portion having a fixed magnetization direction, and a first tunnel barrier layer between the first variable magnetization portion and the first fixed magnetization portion, wherein the first variable magnetization portion, the first tunnel barrier layer, and the first fixed magnetization portion are stacked in the extension direction, and each of the first non-element portions includes:

a first demagnetized portion adjacent to the first variable magnetization portion of one of the first element portions that is adjacent thereto in the stacking direction, and an insulating portion adjacent to the first demagnetized portion in the extension direction.

17. The magnetic storage device according to claim 16, further comprising:

a second stacked structure in which a plurality of second electrode layers and a plurality of second insulating layers are alternately stacked in the stacking direction, the second electrode layers and the second insulating layers extending in the extension direction;

a second common electrode; and a second intermediate structure that is between the second stacked structure and the second common electrode and includes a plurality of second element portions and a plurality of second non-element portions that are alternately stacked in the stacking direction, wherein the first common electrode and the second common electrode are electrically connected to the wiring.

18. The magnetic storage device according to claim 17, further comprising:

a third intermediate structure, and a third common electrode, wherein the first intermediate structure and the second intermediate structure are connected via the third intermediate structure, and the first common electrode and the second common electrode are electrically connected via the third common electrode.

19. The magnetic storage device according to claim 18, wherein a lowermost surface of the third intermediate structure is lower than a lowermost surface of the first stacked structure in the stacking direction.

20. A magnetic storage device, comprising:

a semiconductor substrate;

a first stacked structure in which a plurality of first electrode layers and a plurality of first insulating layers are alternately stacked in a first direction that is perpendicular to the semiconductor substrate;

a first common electrode that extends in the first direction when viewed from a second direction that is perpendicular to the first direction; and a first intermediate structure that is between the first stacked structure and the first common electrode, wherein the first intermediate structure includes a non-element portion and an element portion that are stacked in the first direction, the element portion including a magnetoresistance effect element, a lowermost surface of the first stacked structure contacts the semiconductor substrate, a first side surface of the first intermediate structure contacts the first common electrode, and a second side surface of the first intermediate structure that is opposite to the first side surface is connected to the first common electrode.

* * * * *